(12) United States Patent
Shimomura et al.

(10) Patent No.: US 8,551,828 B2
(45) Date of Patent: Oct. 8, 2013

(54) METHOD OF MANUFACTURING SEMICONDUCTOR DEVICE

(75) Inventors: Akihisa Shimomura, Kanagawa (JP); Hidekazu Miyairi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/011,046

(22) Filed: Jan. 21, 2011

(65) Prior Publication Data

US 2011/0117708 A1 May 19, 2011

Related U.S. Application Data

(62) Division of application No. 12/140,705, filed on Jun. 17, 2008, now Pat. No. 8,093,135.

(30) Foreign Application Priority Data

Jun. 20, 2007 (JP) ................................. 2007-162444
Jun. 20, 2007 (JP) ................................. 2007-162464

(51) Int. Cl.
*H01L 21/00* (2006.01)
*H01L 21/84* (2006.01)

(52) U.S. Cl.
USPC ............................ 438/151; 438/153; 438/154

(58) Field of Classification Search
USPC ......... 438/107, 455–459, 471, 473–475, 795, 438/798, 800
See application file for complete search history.

(56) References Cited

U.S. PATENT DOCUMENTS

| | | | |
|---|---|---|---|
| 5,753,560 A | 5/1998 | Hong et al. |
| 6,271,101 B1 | 8/2001 | Fukunaga |
| 6,344,404 B1 | 2/2002 | Cheung et al. |
| 6,369,410 B1 | 4/2002 | Yamazaki et al. |
| 6,380,007 B1 | 4/2002 | Koyama |
| 6,524,928 B1 | 2/2003 | Hirabayashi |
| 6,602,761 B2 | 8/2003 | Fukunaga |
| 6,743,700 B2 | 6/2004 | Asami et al. |
| 6,808,968 B2 | 10/2004 | Yamazaki et al. |

(Continued)

FOREIGN PATENT DOCUMENTS

| | | |
|---|---|---|
| EP | 0840367 A2 | 5/1998 |
| JP | 02-267950 A | 11/1990 |

(Continued)

OTHER PUBLICATIONS

Search Report (PCT Application No. PCT/JP2008/060928) mailed Sep. 16, 2008, 3 pages.

(Continued)

*Primary Examiner* — Fernando L Toledo
*Assistant Examiner* — Karen Kusumakar
(74) *Attorney, Agent, or Firm* — Fish & Richardson P.C.

(57) ABSTRACT

To suppress an effect of metal contamination caused in manufacturing an SOI substrate. After forming a damaged region by irradiating a semiconductor substrate with hydrogen ions, the semiconductor substrate is bonded to a base substrate. Heat treatment is performed to cleave the semiconductor substrate; thus an SOI substrate is manufactured. Even if metal ions enter the semiconductor substrate together with the hydrogen ions in the step of hydrogen ion irradiation, the effect of metal contamination can be suppressed by the gettering process. Accordingly, the irradiation with hydrogen ions can be performed positively by an ion doping method.

35 Claims, 18 Drawing Sheets

(56) References Cited

U.S. PATENT DOCUMENTS

| | | |
|---|---|---|
| 6,875,633 B2 | 4/2005 | Fukunaga |
| 6,902,987 B1 | 6/2005 | Tong et al. |
| 6,913,956 B2 | 7/2005 | Hamada et al. |
| 6,991,997 B2 | 1/2006 | Takayama et al. |
| 7,045,444 B2 * | 5/2006 | Yamazaki et al. ............ 438/471 |
| 7,052,943 B2 | 5/2006 | Yamazaki et al. |
| 7,115,453 B2 | 10/2006 | Nakamura et al. |
| 7,119,365 B2 | 10/2006 | Takafuji et al. |
| 7,141,822 B2 | 11/2006 | Nakamura et al. |
| 7,153,729 B1 | 12/2006 | Yamazaki et al. |
| 7,176,525 B2 | 2/2007 | Fukunaga |
| 7,232,742 B1 | 6/2007 | Maekawa |
| 7,262,113 B2 | 8/2007 | Ghyselen et al. |
| 7,316,947 B2 | 1/2008 | Yamazaki et al. |
| 7,619,250 B2 | 11/2009 | Takafuji et al. |
| 7,667,235 B2 | 2/2010 | Yamazaki et al. |
| 7,807,500 B2 | 10/2010 | Fukunaga |
| 7,821,005 B2 | 10/2010 | Yamazaki et al. |
| 7,884,367 B2 | 2/2011 | Takafuji et al. |
| 8,143,625 B2 | 3/2012 | Yamazaki et al. |
| 2002/0053318 A1 * | 5/2002 | Levy et al. ............ 117/88 |
| 2002/0151120 A1 | 10/2002 | Yamazaki et al. |
| 2003/0170990 A1 * | 9/2003 | Sakaguchi et al. ............ 438/690 |
| 2003/0183876 A1 | 10/2003 | Takafuji et al. |
| 2004/0038504 A1 | 2/2004 | Ito |
| 2005/0153524 A1 * | 7/2005 | Maa et al. ............ 438/458 |
| 2007/0108510 A1 | 5/2007 | Fukunaga |
| 2007/0166846 A1 | 7/2007 | Sasaki et al. |
| 2010/0144111 A1 | 6/2010 | Fukunaga |
| 2012/0108049 A1 | 5/2012 | Yamazaki et al. |

FOREIGN PATENT DOCUMENTS

| | | |
|---|---|---|
| JP | 02-280380 A | 11/1990 |
| JP | 11-163363 A | 6/1999 |
| JP | 2000-106424 A | 4/2000 |
| JP | 2001-035787 A | 2/2001 |
| JP | 2002-184695 A | 6/2002 |
| JP | 2002-343799 A | 11/2002 |
| JP | 2003-282885 A | 10/2003 |
| JP | 2004-087606 A | 3/2004 |
| JP | 2005-252244 A | 9/2005 |

OTHER PUBLICATIONS

Written Opinion (PCT Application No. PCT/JP2008/060928) mailed Sep. 16, 2008, 4 pages.

Office Action (U.S. Appl. No. 12/140,705) mailed Mar. 28, 2011, 17 pages.

* cited by examiner

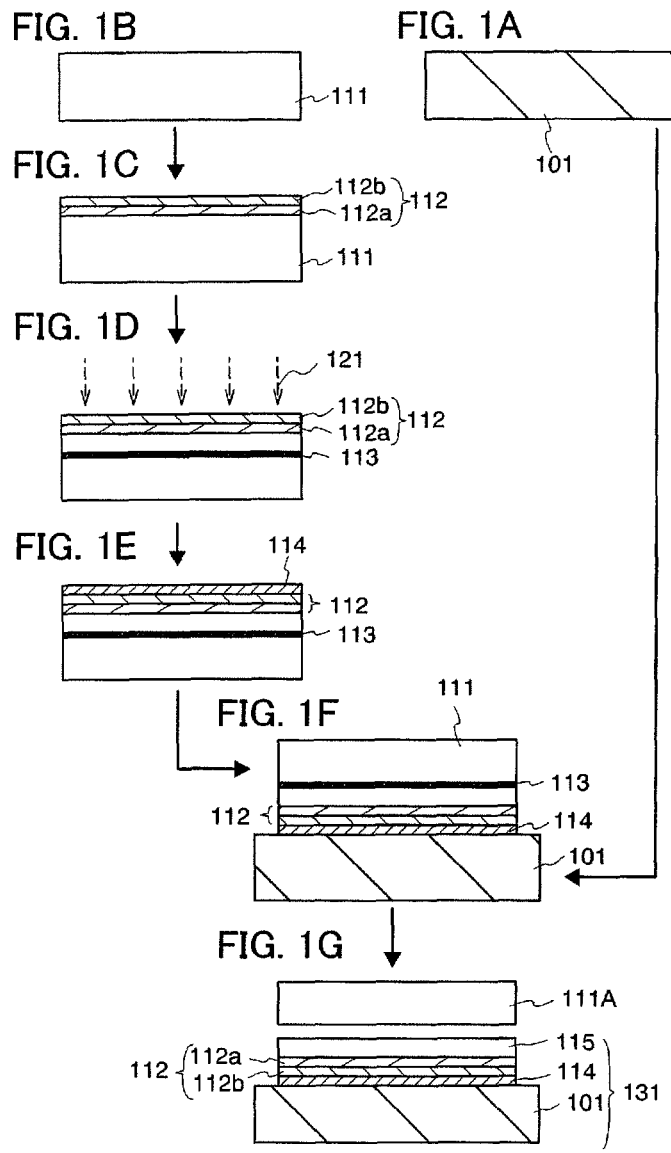

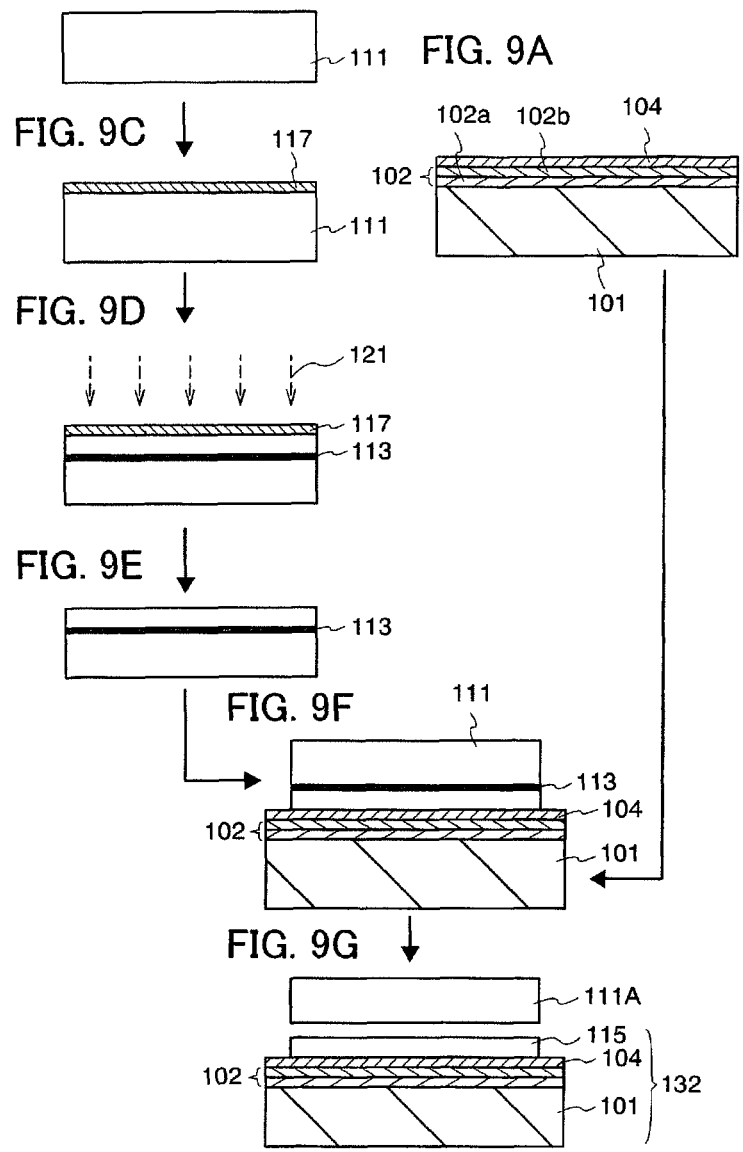

FIG. 12
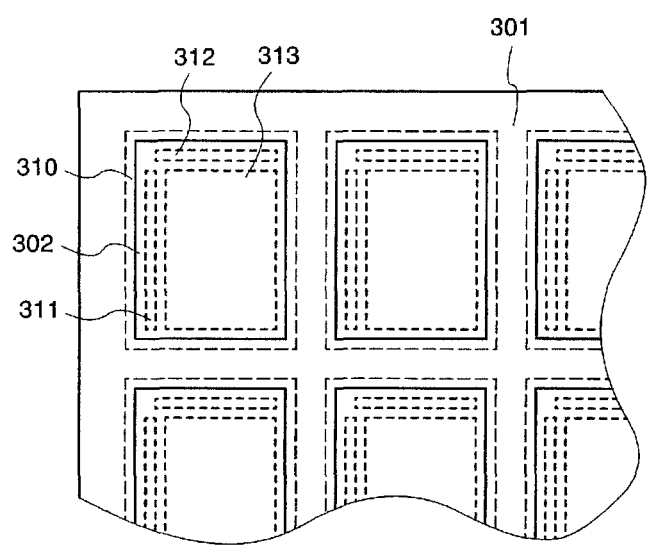
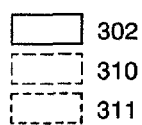

FIG.16

Concentration [atoms/cm$^2$]

| Sample \ Element | Sample A | Comparative Sample X | Minimum limit of detection |
|---|---|---|---|
| Ti | 7.1 × 10$^{10}$ | Lower than minimum limit of detection | 3.1 × 10$^{10}$ |
| Zn | 6.3 × 10$^{11}$ | 4.0 × 10$^{10}$ | 2.3 × 10$^{10}$ |
| Mo | 2.8 × 10$^{12}$ | Lower than minimum limit of detection | 1.6 × 10$^{10}$ |
| Pb | 1.5 × 10$^{10}$ | Lower than minimum limit of detection | 7.3 × 10$^{9}$ |

METHOD OF MANUFACTURING SEMICONDUCTOR DEVICE

CROSS-REFERENCE TO RELATED APPLICATIONS

This application is a divisional of U.S. application Ser. No. 12/140,705, filed Jun. 17, 2008, now pending, which claims the benefit of foreign priority applications filed in Japan as Serial No. 2007-162444 and Serial No. 2007-162464 on Jun. 20, 2007, all of which are incorporated by reference.

TECHNICAL FIELD

The present invention relates to a method of manufacturing a semiconductor device by using an SOI (silicon on insulator) substrate which has a semiconductor layer formed of silicon or the like.

It is to be noted that the semiconductor device in this specification refers to all devices that can function by utilizing semiconductor characteristics, and electro-optic devices, semiconductor circuits, and electronic appliances are all semiconductor devices.

BACKGROUND ART

Integrated circuits using an SOI (silicon on insulator) substrate where a thin single-crystal silicon layer is formed over an insulating layer, instead of using a bulk silicon wafer, have been developed. By taking advantage of features of a thin single-crystal silicon layer, transistors in the integrated circuit can be formed in such a way that the transistors are electrically isolated for each element completely. Further, since the transistors can be formed as fully depleted transistors, a semiconductor integrated circuit can be manufactured to have high added value such as high integration, high-speed driving, and low power consumption.

As one method of manufacturing an SOI substrate, there is a known method of manufacturing an SOI substrate in accordance with a bonding technique in which a hydrogen ion implantation step and a separation step are combined. In this method, an SOI substrate is manufactured mainly by the following process. Hydrogen ions are implanted into a silicon wafer to form a damaged region at a predetermined depth from the surface. A silicon oxide film is formed by oxidizing another silicon wafer which serves as a base substrate. The silicon wafer with the hydrogen ions implanted therein is bonded to the silicon wafer with the silicon oxide film formed therein, so that the two silicon wafers are attached to each other. Heat treatment is performed thereon so that the wafers are cleaved from each other at the damaged region. Another heat treatment is performed in order to improve bonding force of a silicon layer attached to the base substrate.

Moreover, there is another known method of manufacturing an SOI substrate, in which a silicon layer separated from a silicon wafer is attached to a glass substrate (see Patent Document 1: Japanese Published Patent Application No. 2004-087606 and Patent Document 2: Japanese Published Patent Application No. H11-163363).

DISCLOSURE OF INVENTION

In a conventional method of manufacturing an SOI substrate, an ion implantation method has been used in order to implant hydrogen ions into a silicon wafer. In an ion implantation method, a source gas is made into plasma, ion species included in this plasma are extracted and mass-separated, ion species with predetermined mass are accelerated, and an object is irradiated with the accelerated ion species as an ion beam. As another method of implanting ions, an ion doping method is given. In an ion doping method, a source gas is made into plasma, ion species are extracted from this plasma by an operation of a predetermined electric field, the extracted ion species are accelerated without mass separation, and an object is irradiated with the accelerated ion species as an ion beam.

The research of the present applicant has indicated that when a damaged region is formed by implanting ion species produced from a hydrogen gas into a silicon wafer by an ion doping method, the silicon wafer can be cleaved by heat treatment performed at a lower temperature than a strain point of a glass substrate. Based on this knowledge, an SOI substrate was manufactured by forming a damaged region by an ion doping method with the use of a glass substrate whose strain point is 700° C. or lower as a base substrate.

An ion doping apparatus which carries out ion beam irradiation by an ion doping method is the one developed to manufacture thin film transistors over a glass substrate which has a side of longer than one meter. An ion doping method therefore has an advantage in that the tact time of forming a damaged region can be shortened as compared to an ion implantation method in which mass separation is performed. In contrast, mass separation is not performed in an ion doping method; therefore, there is a risk that a metal element included in a material of an electrode and the like of an ion doping apparatus enters a silicon wafer together with the hydrogen ions. A metal-contaminated SOI substrate causes transistors manufactured therewith to have low electrical characteristics and low reliability; for example, the transistors have variation in threshold voltage and increased leak current.

It is an object of the present invention to provide a method of manufacturing a semiconductor device in which an effect of contamination due to a metal element can be suppressed. It is another object of the present invention to provide a method of manufacturing a semiconductor device in which an effect of metal contamination is suppressed and which uses a semiconductor layer attached to a base substrate whose strain point is 700° C. or lower.

An aspect of the present invention relates to a method of manufacturing a semiconductor device, which includes the following steps: forming an SOI substrate including a semiconductor layer separated from a semiconductor substrate and a base substrate to which the semiconductor layer is fixed, and forming a semiconductor element by using the semiconductor layer of this SOI substrate.

In order to manufacture the SOI substrate, a source gas which includes one kind or plural kinds of gases selected from a hydrogen gas, a helium gas, or a halogen gas is/are excited to produce ion species, and the semiconductor substrate is irradiated with the ion species to form a damaged region in the semiconductor substrate. As the source gas, a hydrogen gas, a helium gas, or a halogen gas can be used.

At least one of the base substrate and the semiconductor substrate is provided with a bonding layer used for attaching the base substrate and the semiconductor substrate to each other. When the semiconductor substrate is provided with the bonding layer, the bonding layer may be formed after forming the damaged region; alternatively, the bonding layer may be formed before forming the damaged region.

The base substrate and the semiconductor substrate are attached to each other in such a way that the base substrate and the semiconductor substrate are disposed in close contact with each other with the bonding layer interposed therebetween and that a surface of the bonding layer is bonded to a surface which is in contact with the bonding layer. The surface which is in contact with the bonding layer corresponds to, for example, a surface of the base substrate, a surface of the semiconductor substrate, a surface of an insulating film, or the like.

The damaged region is cracked by heating the semiconductor substrate after attaching the base substrate and the semiconductor substrate to each other. Then, the semiconductor substrate is separated from the base substrate in such a state that a first semiconductor layer separated from the semiconductor substrate is fixed to the base substrate. Through the aforementioned steps, an SOI substrate having the first semiconductor layer attached to the base substrate is manufactured.

The present invention is a method of manufacturing a semiconductor device which uses the SOI substrate manufactured in accordance with the above method. According to an aspect of the present invention, the first semiconductor layer fixed to the base substrate is etched for element isolation to form a second semiconductor layer which constitutes a part of a semiconductor element. In the present invention, a gettering site region is formed in the second semiconductor layer in order to remove a metal element included in this second semiconductor layer. In order to remove a metal element included in a channel formation region, the gettering site region is formed in a portion of the second semiconductor layer that does not overlap with a gate electrode so as not to include a region serving as the channel formation region. After forming the gettering site region, heat treatment is performed to getter the metal element, which is included in the second semiconductor layer, into the gettering site region.

The following three methods are given to form the gettering site region. In the first method, a Group 18 element in the periodic table is added to the semiconductor layer. The Group 18 element corresponds to any of He, Ne, Ar, Kr, or Xe. One kind or two or more kinds of the Group 18 elements can be added to the semiconductor layer. When the semiconductor layer is irradiated with ions of the Group 18 element that are accelerated by an electric field, a gettering site is formed by dangling bonds or lattice distortion. The gettering site region preferably has a concentration of the Group 18 element in the range of from $1 \times 10^{18}$ atoms/cm$^3$ to $1 \times 10^{22}$ atoms/cm$^3$ inclusive. Through heat treatment at about 450° C. to 850° C. for about 1 to 24 hours, the metal elements included in the semiconductor layer are gettered into the gettering site region.

In the second method, phosphorus or arsenic is added to the semiconductor layer to form a region imparting n-type conductivity. Phosphorus and arsenic are preferably added to the gettering site region at a concentration of from $1 \times 10^{20}$ atoms/cm$^3$ to $1 \times 10^{22}$ atoms/cm$^3$ inclusive in total. Through heat treatment at about 450° C. to 850° C. for about 1 to 24 hours, the metal elements included in the semiconductor layer are gettered into the gettering site region.

In the third method, phosphorus and boron are added to the semiconductor layer in such a way that boron is added more than phosphorus so as to form an impurity region imparting p-type conductivity. Phosphorus may be replaced by arsenic. Phosphorus and arsenic are preferably added to the gettering site region at a concentration of from $1 \times 10^{19}$ atoms/cm$^3$ to $1 \times 10^{21}$ atoms/cm$^3$ inclusive in total. The concentration of boron is 1.5 times to 3 times higher than the concentration of phosphorus and arsenic in total included in the gettering site region. Through heat treatment at about 450° C. to 850° C. for about 1 to 24 hours, the metal elements included in the semiconductor layer are gettered into the gettering site region.

In another aspect of the method of manufacturing a semiconductor device of the present invention, the gettering site region is formed in the first semiconductor layer fixed to the base substrate. In order to remove the metal element included in the channel formation region, the gettering site region is formed in a portion where the first semiconductor layer does not overlap with a gate electrode, so that the gettering site region does not include a region which will serve as the channel formation region. After forming the gettering site region, heat treatment is performed to getter the metal element, which is included in the first semiconductor layer, into the gettering site region. After the heat treatment for the gettering, the first semiconductor layer of the SOI substrate is isolated for each element and the gettering site region is removed, thereby forming the second semiconductor layer.

Since the present invention includes the step of gettering the metal element into the gettering site region, it is possible to suppress an effect of metal contamination caused in a process of manufacturing a semiconductor device. Accordingly, it is possible to improve reliability and electrical characteristics of transistors; for example, variation in a threshold voltage can be suppressed and leak current can be reduced in the transistors.

Moreover, in the present invention, since the effect of metal contamination caused in a process of manufacturing the SOI substrate can be suppressed, an ion doping apparatus having a risk of causing metal contamination can be used positively. Therefore, by formation of a damaged region with the use of an ion doping apparatus, the tact time of the ion irradiation step can be shortened.

The heat treatment for gettering the metal element into the gettering site region can be performed below a strain point of a glass substrate; therefore, a glass substrate can be used as a base substrate to which the semiconductor layer will be attached. Accordingly, a semiconductor device of high performance and high reliability can be manufactured over a glass substrate.

BRIEF DESCRIPTION OF DRAWINGS

FIGS. 1A to 1G are cross-sectional views for describing a method of manufacturing a semiconductor device.

FIGS. 9A to 9G are cross-sectional views for describing a method of manufacturing an SOI substrate.

FIG. 12 is a top view of an SOI substrate using mother glass for a base substrate.

FIG. 16 is a chart showing metal elements included in a silicon oxynitride film and their concentrations, which are detected by ICP-MS.

BEST MODE FOR CARRYING OUT THE INVENTION

Figure 2A:
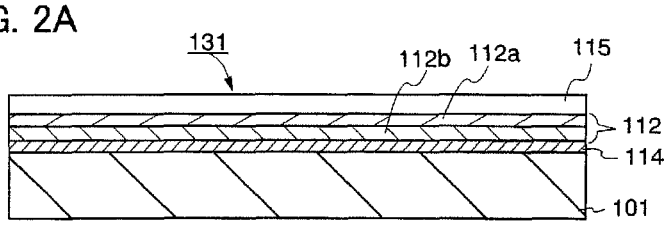
FIGS. 2A to 2D are cross-sectional views for describing a method of manufacturing a semiconductor device, after the step of FIG. 1G.

The present invention will hereinafter be described. Since the present invention can be carried out in many different modes, it is easily understood by those skilled in the art that the mode and detail can be variously changed without departing from the scope and spirit of the present invention. Therefore, the present invention will not be construed as being limited to the description of the embodiment modes. It is to be noted that elements denoted with the same reference numerals throughout the drawings are the same, and explanation on the material, shape, manufacturing method thereof and the like will not be repeated.

(Embodiment Mode 1)

This embodiment mode will explain a method of manufacturing an SOI substrate, and a method of manufacturing a semiconductor device with the use of the SOI substrate. First, a method of manufacturing an SOI substrate will be explained with reference to FIGS. 1A to 1G.

A base substrate 101 is prepared as shown in FIG. 1A. The base substrate 101 is a support substrate which supports a semiconductor layer divided from a semiconductor substrate. As the base substrate 101, a light-transmitting glass substrate which is used for an electronic product such as a liquid crystal display device can be used. In consideration of heat resistance, price, and the like, substrates with coefficients of thermal expansion ranging from $25 \times 10^{-7}/°$C. to $50 \times 10^{-7}/°$C. (preferably $30 \times 10^{-7}/°$C. to $40 \times 10^{-7}/°$C.) inclusive and strain points ranging from 580° C. to 680° C. (preferably 600° C. to 680° C.) inclusive are preferably used. In order to suppress contamination of the semiconductor device, moreover, the glass substrates are preferably alkali-free glass substrates. Materials of alkali-free substrates include glass materials such as aluminosilicate glass, aluminoborosilicate glass, and barium borosilicate glass.

As an alternative to such glass substrates, an insulating substrate such as a ceramic substrate, a quartz substrate, or a sapphire substrate; a conductive substrate such as a metal substrate or a stainless steel substrate; or a semiconductor substrate formed of silicon, gallium arsenide, or the like can be used as the base substrate 101.

As shown in FIG. 1B, a semiconductor substrate 111 is prepared. The semiconductor layer separated from the semiconductor substrate 111 is attached to the base substrate 101; thus an SOI substrate is manufactured. The semiconductor substrate 111 is preferably a single-crystal semiconductor substrate, and a poly-crystalline semiconductor substrate can alternatively be used. The semiconductor substrate 111 may be a semiconductor substrate formed of a Group 4 element such as silicon, germanium, silicon germanium, or silicon carbide. In this embodiment mode, the base substrate 101 is larger in size than the semiconductor substrate 111.

As shown in FIG. 1C, an insulating layer 112 is formed over the semiconductor substrate 111. The insulating layer 112 can have a single-layer structure or a multilayer structure including two or more layers. The total thickness of the insulating layer 112 can be set in the range of from 5 nm to 400 nm inclusive. The insulating layer 112 can include an insulating film containing silicon or germanium in its composition, such as a silicon oxide film, a silicon nitride film, a silicon oxynitride film, a silicon nitride oxide film, a germanium oxide film, a germanium nitride film, a germanium oxynitride film, or a germanium nitride oxide film Moreover, an insulating film including a metal oxide such as aluminum oxide, tantalum oxide, or hafnium oxide; an insulating film including a metal nitride such as aluminum nitride; an insulating film including a metal oxynitride such as aluminum oxynitride; or an insulating film including a metal nitride oxide such as aluminum nitride oxide can be used.

In this specification, the oxynitride refers to a substance which contains more oxygen atoms than nitrogen atoms; whereas the nitride oxide refers to a substance which contains more nitrogen atoms than oxygen atoms. The composition of the oxynitride and the nitride oxide can be measured by using Rutherford Backscattering Spectrometry (RBS) and Hydrogen Forward Scattering (HFS). For example, silicon oxynitride refers to a substance which contains oxygen in the range of from 50 at. % to 65 at. % inclusive, nitrogen in the range of from 0.5 at. % to 20 at. % inclusive, silicon in the range of from 25 at. % to 35 at. % inclusive, and hydrogen in the range of from 0.1 at. % to 10 at. % inclusive. Silicon nitride oxide refers to, for example, a substance which contains oxygen in the range of from 5 at. % to 30 at. % inclusive, nitrogen in the range of from 20 at. % to 55 at. % inclusive, silicon in the range of from 25 at. % to 35 at. % inclusive, and hydrogen in the range of from 10 at. % to 30 at. % inclusive. It is to be noted that the content ratio of oxygen, nitrogen, hydrogen, and silicon of silicon oxynitride and silicon nitride oxide is the value when the total content ratio of the elements constituting the substance is 100 at. %.

The insulating film for forming the insulating layer 112 can be formed by a CVD method, a sputtering method, or a method of, for example, oxidizing or nitriding the semiconductor substrate 111.

When the base substrate 101 is a substrate including an impurity which decreases the reliability of the semiconductor device, such as alkali metal or alkaline earth metal, the insulating layer 112 preferably includes at least one film capable of preventing diffusion of such an impurity from the base substrate 101 into the semiconductor layer of the SOI substrate. As the film for preventing impurity diffusion, a silicon nitride film, a silicon nitride oxide film, an aluminum nitride film, an aluminum nitride oxide film, or the like is given. With the provision of such a film, the insulating layer 112 can function as a barrier layer.

For example, in a case of forming the insulating layer 112 as a barrier layer with a single-layer structure, a silicon nitride film, a silicon nitride oxide film, an aluminum nitride film, or an aluminum nitride oxide film each having a thickness of from 5 nm to 200 nm inclusive can be used as the insulating layer 112.

In a case of forming the insulating layer 112 as a barrier layer with a two-layer structure, the upper layer is an insulating film with a high barrier property. A silicon nitride film, a silicon nitride oxide film, an aluminum nitride film, or an aluminum nitride oxide film each having a thickness of 5 nm to 200 nm inclusive can be used as the upper layer. These films have a high blocking effect for preventing impurity diffusion, but their internal stress is also high. Therefore, as the lower layer of the insulating film which is in contact with the semiconductor substrate 111, a film with an effect of relieving the stress of the upper layer of the insulating film is preferable. As the insulating film having such an effect, a silicon oxide film, a silicon oxynitride film, a thermal oxide film formed by thermally oxidizing the semiconductor substrate 111, or the like is given. The lower layer of the insulating film can be formed in a thickness of from 5 nm to 300 nm inclusive.

In this embodiment mode, the insulating layer 112 has a two-layer structure including an insulating film 112a and an insulating film 112b. As a combination of the insulating film 112a and the insulating film 112b when the insulating layer 112 functions as a blocking film, for example, the following combinations are given: a silicon oxide film and a silicon nitride film, a silicon oxynitride film and a silicon nitride film, a silicon oxide film and a silicon nitride oxide film, and a silicon oxynitride film and a silicon nitride oxide film.

For example, as the insulating film 112a, which is the lower layer, a silicon oxynitride film can be formed by a plasma CVD method with the use of $SiH_4$ and $N_2O$ as a source gas. As the insulating film 112b, which is the upper layer, a silicon nitride oxide film can be formed by a plasma CVD method with the use of $SiH_4$, $N_2O$, and $NH_3$ as a source gas. Alternatively, as the insulating film 112a, a silicon oxide film can be formed by a plasma CVD method with the use of an organic silane gas and oxygen as a source gas.

As the organic silane, for example, the following compounds are given: tetraethoxysilane (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), and the like.

Next, as shown in FIG. 1D, an ion beam 121 including ions accelerated by an electric field is implanted (irradiation) to the semiconductor substrate 111 through the insulating layer 112, thereby forming a damaged region 113 in the semiconductor substrate 111 at a predetermined depth from the surface thereof. In this ion irradiation step, the semiconductor substrate 111 is irradiated with the ion beam 121 including the accelerated ion species, so that elements which constitute the ion species are added to the semiconductor substrate 111. Therefore, when the semiconductor substrate 111 is irradiated with the ion beam 121, a weakened layer of which crystal structure is weakened is formed in the semiconductor substrate 111 at a predetermined depth due to the shock of the accelerated ion species. This weakened layer corresponds to the damaged layer 113. The depth at which the damaged region 113 is formed can be adjusted by the acceleration energy of the ion beam 121 and the angle at which the ion beam 121 enters. The acceleration energy can be adjusted by an acceleration voltage, dosage, or the like. The damaged region 113 is formed as deep as the average depth at which the ions have entered. That is to say, the thickness of the semiconductor layer which will be separated from the semiconductor substrate 111 is determined based on the depth at which the ions enter. The depth at which the damaged region 113 is formed ranges from 50 nm to 500 nm inclusive, and preferably from 50 nm to 200 nm inclusive.

In order to irradiate the semiconductor substrate 111 with the ion beam 121, an ion doping method in which mass separation is not performed can be employed as an alternative to an ion implantation method in which mass separation is performed.

When hydrogen ($H_2$) is used for a source gas, $H^+$, $H_2^+$, and $H_3^+$ can be produced by exciting a hydrogen gas. The proportion of ion species produced from the source gas can be changed by adjusting a plasma excitation method, pressure in an atmosphere for generating plasma, the amount of supplying the source gas, and the like. In a case of forming the damaged region by an ion doping method, it is preferable that $H_3^+$ occupy 70% or more of the total amount of $H^+$, $H_2^+$, and $H_3^+$ in the ion beam 121, and it is more preferable that $H_3^+$ occupy 80% or more. When $H_3^+$ occupies 70% or more, the proportion of $H_2^+$ ions in the ion beam 121 gets smaller relatively, which results in lower variation in the average depth at which the hydrogen ions in the ion beam 121 enter. Consequently, the ion implantation efficiency improves and the tact time can be shortened.

In order to form the damaged region 113 in a shallow region, the ion acceleration voltage needs to be low. However, by increasing the proportion of $H_3^+$ ions in the plasma generated by exciting the hydrogen gas, hydrogen in an atom form (H) can be added to the semiconductor substrate 111 efficiently. This is because an $H_3^+$ ion has three times as large mass as an $H^+$ ion, and in the case of adding the hydrogen atoms to the same depth, the accelerating voltage of the $H_3^+$ ion can be made three times higher than that of the $H^+$ ion. When the accelerating voltage of the ions is increased, the tact time in the ion irradiation step can be shortened, and productivity and throughput can be improved. Therefore, the increase in proportion of the $H_3^+$ ions included in the ion beam 121 leads to lower variation in the average depth at which the hydrogen enters; accordingly, in the semiconductor substrate 111, the hydrogen concentration profile in the depth direction becomes steeper and the peak position of the profile can shift to a shallow region.

In the case of performing ion irradiation by an ion doping method with the use of the hydrogen gas, the acceleration voltage can be set in the range of from 10 kV to 200 kV inclusive, and the dosage is set in the range of from $1\times10^{16}$ ions/cm$^2$ to $6\times10^{16}$ ions/cm$^2$ inclusive. By the irradiation with the hydrogen ions under this condition, the damaged region 113 can be formed to a depth of from 50 nm to 500 nm inclusive in the semiconductor substrate 111, though depending on the ion species and its proportion in the ion beam 121.

For example, the semiconductor layer with a thickness of approximately 120 nm can be separated from the semiconductor substrate 111 when the semiconductor substrate 111 is a single-crystal silicon substrate, the insulating film 112a is a 50-nm-thick silicon oxynitride film, the insulating film 112b is a 50-nm-thick silicon nitride oxide film, the source gas is hydrogen, the acceleration voltage is 40 kV, and the dosage is $2\times10^{16}$ ions/cm$^2$. Alternatively, when the irradiation with the hydrogen ions is performed under the aforementioned condition except that the insulating film 112a is a 100-nm-thick silicon oxynitride film, the semiconductor layer with a thickness of approximately 70 nm can be separated from the semiconductor substrate 111.

Helium (He) can alternatively be used as a source gas of the ion irradiation step. Since most of the ion species produced by exciting helium are He$^+$, the semiconductor substrate 111 can be irradiated mainly with He$^+$ even in an ion doping method in which mass separation is not performed. Therefore, microvoids can be formed in the damaged region 113 efficiently by an ion doping method. When ion irradiation is performed using helium by an ion doping method, the acceleration voltage is set in the range of from 10 kV to 200 kV inclusive, and the dosage is set in the range of from $1 \times 10^{16}$ ions/cm$^2$ to $6 \times 10^{16}$ ions/cm$^2$ inclusive.

A halogen gas such as a chlorine gas (Cl$_2$ gas) or a fluorine gas (F$_2$ gas) can be used as the source gas.

After forming the damaged region 113, a bonding layer 114 is formed on a top surface of the insulating layer 112, as shown in FIG. 1E. In a step of forming the bonding layer 114, the semiconductor substrate 111 is heated at temperatures at which elements or molecules added in the damaged region 113 are not separated out; specifically, the temperatures are preferably 350° C. or lower. In other words, the damaged region 113 does not release gas within this heat temperature range. It is to be noted that the bonding layer 114 can be formed before the ion irradiation step. In the latter case, the process temperature at the time of forming the bonding layer 114 can be set at or above 350° C.

The bonding layer 114 serves as a layer for forming a bonding surface, which is flat and hydrophilic, on a surface of the semiconductor substrate 111. Therefore, the bonding layer 114 preferably has an average surface roughness Ra of less than 0.8 nm, and a root-mean-square roughness Rms of less than 0.9 nm. The thickness of the bonding layer 114 can range from 10 nm to 200 nm inclusive. The thickness of the bonding layer 114 is preferably in the range of from 5 nm to 500 nm inclusive, and more preferably 10 nm to 200 nm inclusive.

The bonding layer 114 is preferably an insulating film formed by a chemical reaction, and a silicon oxide film is preferred. In a case of forming a silicon oxide film by a plasma CVD method as the bonding layer 114, it is preferable to use an organic silane gas and an oxygen (O$_2$) gas as a source gas. By using organic silane as the source gas, it is possible to form a silicon oxide film having a flat surface at process temperatures of 350° C. or lower. Alternatively, a low temperature oxide (LTO) formed at temperatures of from 200° C. to 500° C. inclusive by a thermal CVD method can be used. LTO can be formed by using monosilane (SiH$_4$), disilane (Si$_2$H$_6$), or the like as a silicon source gas and using dinitrogen monoxide (N$_2$O) or the like as an oxygen source gas.

In the case of using the semiconductor substrate as the base substrate 101, it is also possible to form the bonding layer 114 with the use of an oxide film obtained by oxidizing the semiconductor substrate 111, instead of forming the insulating layer 112.

FIG. 1F is a cross-sectional view for explaining a bonding step, which shows a state in which the base substrate 101 and the semiconductor substrate 111 are attached to each other. To perform the bonding step, first, the base substrate 101 and the semiconductor substrate 111 with the bonding layer 114 and the insulating layer 112 formed are subjected to ultrasonic cleaning. The ultrasonic cleaning is preferably megahertz ultrasonic cleaning (megasonic cleaning). After the megahertz ultrasonic cleaning, one of or both the base substrate 101 and the semiconductor substrate 111 can be cleaned with the use of ozone water. By cleaning with the use of ozone water, organic substances can be removed and the surface can be made more hydrophilic.

After the cleaning step, the base substrate 101 and the semiconductor substrate 111 are attached to each other with the bonding layer 114 interposed therebetween. First, Van der Waals force acts on an interface between the bonding layer 114 and the base substrate 101. By addition of force so that the surface of the base substrate 101 and the surface of the bonding layer 114 have a close contact with each other, a chemical bond is formed at the interface between the base substrate 101 and the bonding layer 114, whereby the base substrate 101 and the bonding layer 114 are bonded to each other. Since the bonding step does not need heat treatment and proceeds at room temperature, a substrate with low heat resistance, such as a glass substrate, can be used as the base substrate 101.

After making the base substrate 101 and the semiconductor substrate 111 have a close contact with each other, it is preferable to perform heat treatment in order to increase bonding force at the bonding interface between the base substrate 101 and the bonding layer 114. The heat treatment is performed at temperatures of from 70° C. to 300° C. inclusive so that the damaged region 113 does not crack.

Subsequently, another heat treatment is performed at or above 400° C. to divide the semiconductor substrate 111 at the damaged region 113, so that a semiconductor layer 115 is separated from the semiconductor substrate 111. With reference to FIG. 1G, a separation step of separating the semiconductor layer 115 from the semiconductor substrate 111 is explained. As shown in FIG. 1G the semiconductor layer 115 is formed over the base substrate 101 by the separation step. Reference numeral 111A denotes the semiconductor substrate 111 from which the semiconductor layer 115 has been separated.

Through the heat treatment at or above 400° C., hydrogen binding formed at the bonding interface between the base substrate 101 and the bonding layer 114 turns into covalent binding; therefore, the bonding force increases. As the temperature rises, the elements added in the ion irradiation step are separated out into the microvoids formed in the damaged region 113, whereby internal pressure increases. Due to the increase in pressure, the microvoids of the damaged region 113 change in volume to cause the damaged region 113 to crack. As a result, the semiconductor substrate 111 is cleaved along the damaged region 113. Since the bonding layer 114 is bonded to the base substrate 101, the semiconductor layer 115 separated from the semiconductor substrate 111 is fixed onto the base substrate 101. The temperature at the heat treatment for separating the semiconductor layer 115 from the semiconductor substrate 111 is set in the range of from 400° C. to 700° C. inclusive so as not to exceed the strain point of the base substrate 101.

Through the separation step shown in FIG. 1G an SOI substrate 131 in which the semiconductor layer 115 is attached to the base substrate 101 is obtained. The SOI substrate 131 has a multilayer structure in which the bonding layer 114, the insulating layer 112, and the semiconductor layer 115 are stacked over the base substrate 101 in this order and in which the base substrate 101 and the bonding layer 114 are bonded to each other. If the insulating layer 112 is not formed, the SOI substrate 131 is a substrate in which the semiconductor layer 115 is in contact with the bonding layer 114.

It is to be noted that the heat treatment for separating the semiconductor layer 115 from the semiconductor substrate 111 can be performed successively in the same apparatus as that used in the heat treatment for increasing the bonding force. Alternatively, the two heat treatment can be performed in different apparatuses. For example, in the case of using the same furnace, the two treatment are performed as follows: (1) heat treatment is performed at 200° C. for two hours, (2) the heat temperature is increased to 600° C. to perform another heat treatment at 600° C. for two hours, and (3) the temperature is decreased to be in the range of about 400° C. to room temperature and the semiconductor substrate 111A and the SOI substrate 131 are taken out from the furnace.

In the case of performing the two heat treatment in different apparatuses, for example, heat treatment is performed at 200° C. for two hours in a furnace and then the base substrate 101 and the semiconductor substrate 111 which are attached to each other are taken out from the furnace. Next, heat treatment is performed at temperatures in the range of from 600° C. to 700° C. inclusive for 1 to 30 minutes in a rapid thermal annealing (RTA) apparatus, so that the semiconductor substrate 111 is divided at the damaged region 113.

The semiconductor layer 115 of the SOI substrate 131 has crystal defects formed by the separation step and the formation of the damaged region 113, and the surface of the semiconductor layer 115 is not flat. In order to decrease the crystal defects, it is preferable to recrystallize the semiconductor layer 115 by irradiating the semiconductor layer 115 with laser light. Moreover, in order to remove the damage of the surface of the semiconductor layer 115 to flatten the surface, the surface of the semiconductor layer 115 is preferably polished by using a chemical mechanical polishing (CMP) apparatus.

Next, a method of manufacturing a semiconductor device with the use of the SOI substrate 131 is explained. A method of manufacturing an n-channel thin film transistor and a p-channel thin film transistor is explained as the method of manufacturing a semiconductor device, with reference to FIGS. 2A to 2D and FIGS. 3A to 3C. Various kinds of semiconductor devices can be formed by combining a plurality of thin film transistors (TFTs).

Figure 2B:
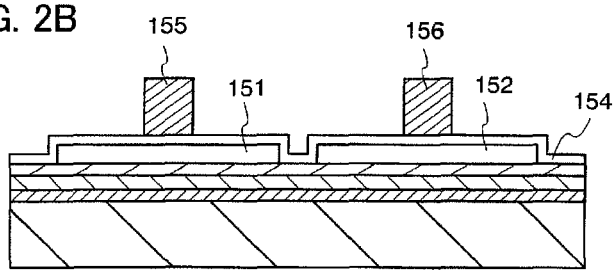

FIG. 2A is a cross-sectional view of the SOI substrate 131 manufactured by the method described with reference to FIGS. 1A to 1G The semiconductor layer 115 of the SOI substrate is isolated for each element by etching, whereby semiconductor layers 151 and 152 are formed as shown in FIG. 2B. The semiconductor layer 151 constitutes a part of an n-channel TFT, whereas the semiconductor layer 152 constitutes a part of a p-channel TFT. An insulating layer 154 is formed over the semiconductor layer 151 and the semiconductor layer 152. Next, a gate electrode 155 is formed over the semiconductor layer 151 and a gate electrode 156 is formed over the semiconductor layer 152, each having the insulating layer 154 interposed therebetween.

Before etching the semiconductor layer 115, it is preferable to add an impurity element which serves as an acceptor, such as boron, aluminum, or gallium, or an impurity element which serves as a donor, such as phosphorus or arsenic, to the semiconductor layer 115 in order to control the threshold voltage of the TFTs. For example, an acceptor is added to a region where an n-channel TFT is formed, and a donor is added to a region where a p-channel TFT is formed.

Figure 2C:
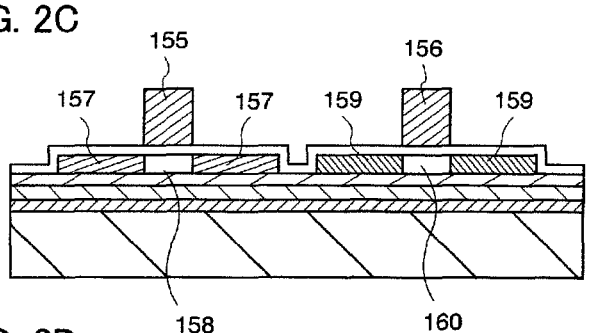

Next, as shown in FIG. 2C, n-type low-concentration impurity regions 157 are formed in the semiconductor layer 151 and p-type high-concentration impurity regions 159 are formed in the semiconductor layer 152. First, the n-type low-concentration impurity regions 157 are formed in the semiconductor layer 151. In order to form the n-type low-concentration impurity regions 157, the semiconductor layer 152 where a p-channel TFT is formed is covered with a resist mask, and a donor is added to the semiconductor layer 151. Phosphorus or arsenic may be added as the donor. When the donor is added by an ion doping method or an ion implantation method, the n-type low-concentration impurity regions 157 are formed in the semiconductor layer 151 in a self-aligning manner because the gate electrode 155 functions as a mask. A region of the semiconductor layer 151 that overlaps with the gate electrode 155 serves as a channel formation region 158.

Next, after removing the mask which covers the semiconductor layer 152, the semiconductor layer 151 where an n-channel TFT is formed is covered with a resist mask. Next, an acceptor is added to the semiconductor layer 152 by an ion doping method or an ion implantation method. Boron can be added as the acceptor. In the step of adding the acceptor, the p-type high-concentration impurity regions 159 are formed in the semiconductor layer 152 in a self-aligning manner because the gate electrode 156 functions as a mask. The high-concentration impurity regions 159 function as a source region and a drain region. A region of the semiconductor layer 152 that overlaps with the gate electrode 156 serves as a channel formation region 160. Here, explanation has been made on the method in which the p-type high-concentration impurity regions 159 are formed after forming the n-type low-concentration impurity regions 157; however, the p-type high-concentration impurity regions 159 can be formed first.

Figure 2D:
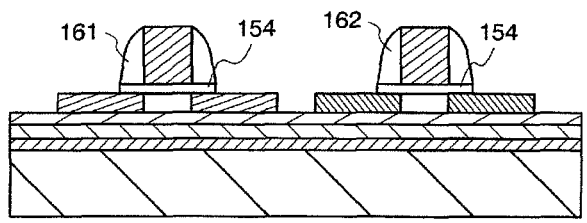

Next, after removing the resist that covers the semiconductor layer 151, an insulating film having a single-layer structure or a stacked-layer structure, which includes a nitrogen compound such as silicon nitride or an oxide such as silicon oxide, is formed by a plasma CVD method or the like. This insulating film is anisotropically etched in a perpendicular direction, whereby sidewall insulating layers 161 and 162 are formed in contact with side surfaces of the gate electrodes 155 and 156 respectively, as shown in FIG. 2D. By this anisotropic etching, the insulating layer 154 is also etched.

Subsequently, in order to form gettering site regions, a Group 18 element is added to each of the semiconductor layers 151 and 152. As the Group 18 element, one kind or plural kinds of elements selected from helium (He), neon (Ne), argon (Ar), krypton (Kr), or xenon (Xe) can be used. The Group 18 element can be added by an ion implantation method in which mass separation is performed or by an ion doping method in which mass separation is not performed. An ion doping method is preferable because tact time can be shortened.

The aim of adding the Group 18 elements to the semiconductor layers 151 and 152 is to form gettering sites in the semiconductor layers 151 and 152 by distorting the semiconductor layers 151 and 152. There are two factors that cause the distortion by the addition of the Group 18 element. One is the formation of dangling bonds in crystals by adding the Group 18 element, and the other is the addition of the Group 18 element between crystal lattices.

Figure 3A:
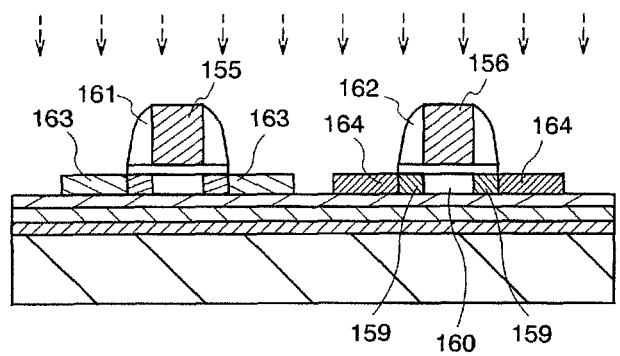
FIGS. 3A to 3C are cross-sectional views for describing a method of manufacturing a semiconductor device, after the step of FIG. 2D.

In this embodiment mode, the Group 18 elements are added by using the gate electrodes 155 and 156 and the sidewall insulating layers 161 and 162 as masks, whereby gettering site regions 163 and 164 are formed in the semiconductor layers 151 and 152 in a self-aligning manner, as shown in FIG. 3A. Similar to the high-concentration impurity regions 159, the gettering site regions 164 of a p-channel TFT serve as a source region and a drain region. The concentration of the Group 18 elements in the gettering site regions 163 and 164 can be set in the range of from $1\times10^{18}/cm^3$ to $1\times10^{22}/cm^3$ inclusive, and is preferably in the range of $1\times10^{20}/cm^3$ to $5\times10^{21}/cm^3$ inclusive.

Figure 3B:
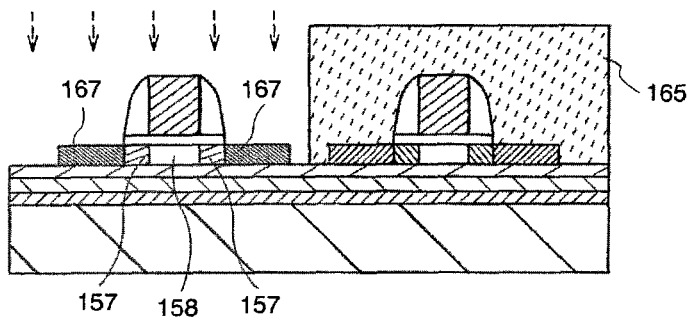

Next, as shown in FIG. 3B, the semiconductor layer 152 is covered with a resist 165. In order to form high-concentration impurity regions which function as a source region and a drain region in the semiconductor layer 151, a large dosage of donors are added to the semiconductor layer 151 by an ion implantation method or an ion doping method. The gate electrode 155 and the sidewall insulating layers 161 serve as masks when donors are added to the gettering site regions 163, whereby gettering site regions 167 are formed as n-type high-concentration impurity regions. The gettering site regions 167 function as a source region and a drain region.

Figure 3C:
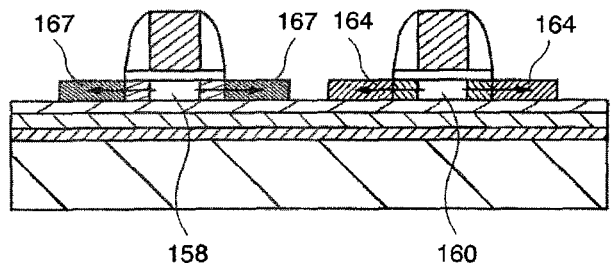

Next, heat treatment is performed for activating the donors and acceptors and for gettering. FIG. 3C illustrates a step of the heat treatment. The heat treatment is performed at temperatures in the range of from 450° C. to 850° C. inclusive for 1 to 24 hours, whereby the donors added to the semiconductor layer 151 and the acceptors added to the semiconductor layer 152 are activated. Through this heat treatment, metal elements included in the channel formation regions 158 and 160 are separated out or diffuse into the gettering site regions 167 and 164 so as to be captured in the gettering site regions 167 and 164. As a result, the concentration of the metal elements in the channel formation regions 158 and 160 can be decreased. This heat treatment is preferably performed at temperatures ranging from 500° C. to 700° C. inclusive.

In this embodiment mode, one of factors to cause metal contamination of the channel formation regions 158 and 160 is in an ion irradiation step performed by an ion doping method at the time of forming the damaged region 113 shown in FIG. 1D. FIG. 16, FIG. 17, FIG. 18, and FIG. 19 show results of analyzing metal contamination of a single-crystal silicon wafer irradiated with hydrogen ions by an ion doping method.

FIG. 16 shows measurement results by Inductively Coupled Plasma Mass Spectrometry (ICP-MS). Samples analyzed by ICP-MS are Sample A doped with hydrogen ions by an ion doping method and Comparative Sample X not doped with hydrogen ions. Sample A was manufactured as follows. A silicon oxynitride film was formed in 600 nm thick on a top surface of a single-crystal silicon wafer by a plasma CVD method by using $SiH_4$ and $N_2O$ as a material. The silicon wafer was irradiated with hydrogen ions through this silicon oxynitride film by an ion doping method. Hydrogen was used as a source gas of the hydrogen ions. In contrast, Comparative Sample X is a silicon wafer on which a silicon oxynitride film was formed in 600 nm thick under the same condition as that of Sample A, but not doped with hydrogen ions.

Figure 17:
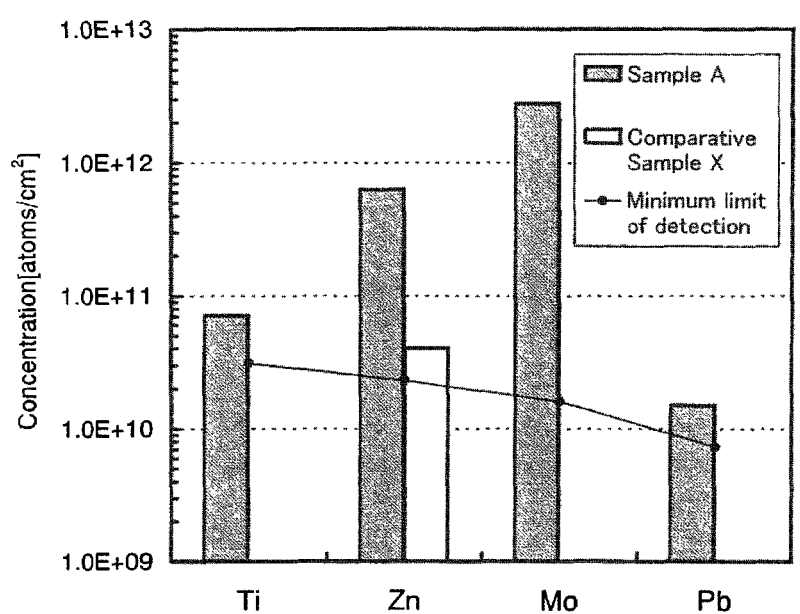
FIG. 17 is a graph showing results of analysis of FIG. 16.

FIG. 16 shows results of analyzing the elements included in the silicon oxynitride films of Sample A and Comparative Sample X by ICP-MS. FIG. 16 shows metal elements of which concentrations are different by 10 times or more between Sample A and Comparative Sample X. FIG. 17 is a graph based on the data shown in the chart of FIG. 16. From the analysis results by ICP-MS, it is thought that ions of Ti, Zn, Mo, and Pb enter the silicon oxynitride films and the silicon wafers together with the hydrogen ions. For example, Mo is an electrode material of an ion doping apparatus.

Figure 18:
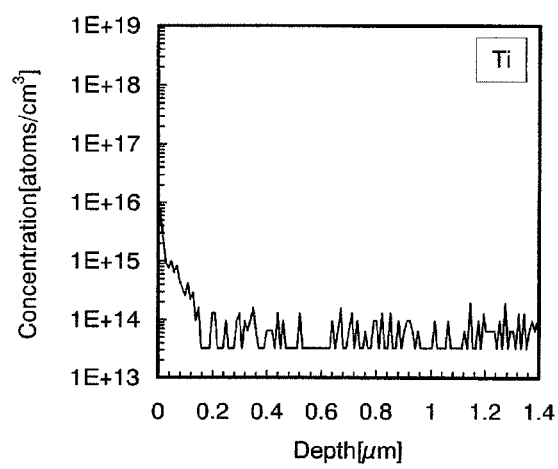
FIG. 18 shows a Ti profile in a depth direction in a silicon wafer, which is analyzed by SIMS.
Figure 19:
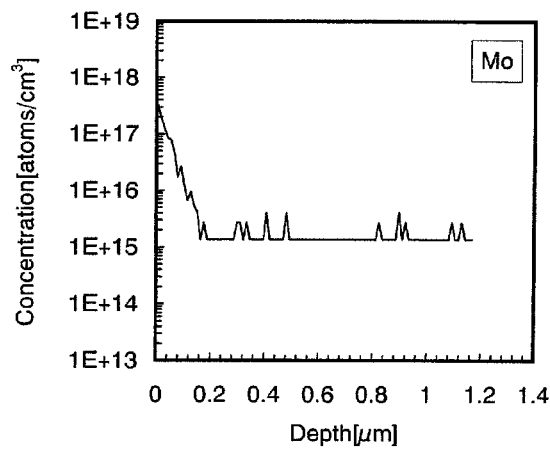
FIG. 19 shows a Mo profile in a depth direction in a silicon wafer, which is analyzed by SIMS.

Next, the distribution of metal elements in a silicon wafer doped with hydrogen ions by an ion doping method in a depth direction (this distribution is called depth profile) was analyzed by secondary ion mass spectrometry (SIMS). FIGS. 18 and 19 each show a depth profile of the metal element in the silicon wafer. FIG. 18 shows a Ti profile, and FIG. 19 shows a Mo profile. This sample is a single-crystal silicon wafer irradiated with hydrogen ions by an ion doping method, and a silicon oxynitride film is not formed over this wafer. From the depth profiles shown in FIGS. 18 and 19, it is understood that the metal elements enter the silicon wafer by doping with hydrogen ions without mass separation.

The analysis results of FIGS. 16 to 19 indicate that the metal contamination of the semiconductor layer of the SOI substrate becomes remarkable due to the ion irradiation by an ion doping method in forming the damaged region. This embodiment mode is to solve this metal contamination, and gettering is performed in a process of manufacturing a semiconductor element, after manufacturing the SOI substrate. Therefore, since the effect of metal contamination on TFTs can be suppressed by this embodiment mode, the ion irradiation by an ion doping method can be carried out positively in forming the damaged region 113. That is to say, when the damaged region 113 is formed by using an ion shower doping apparatus in accordance with this embodiment mode, the tact time can be shortened and moreover the effect of metal contamination can be suppressed.

Figure 4:
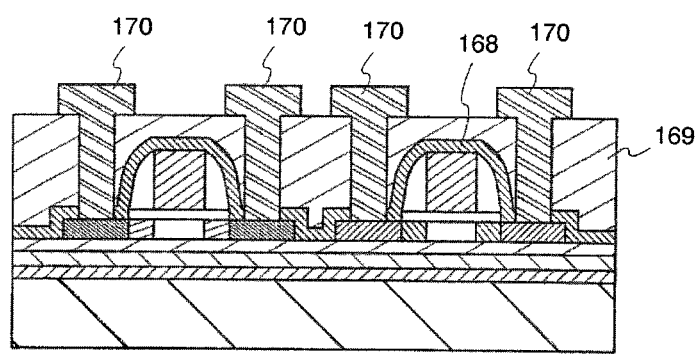
FIG. 4 is a cross-sectional view for describing a method of manufacturing a semiconductor device, after the step of FIG. 3C.

After the heat treatment for activating and gettering, an insulating layer 168 containing hydrogen is formed as shown in FIG. 4. After forming the insulating layer 168, heat treatment is performed at temperatures ranging from 350° C. to 450° C. inclusive so that hydrogen in the insulating layer 168 diffuses into the semiconductor layers 151 and 152. The insulating layer 168 can be formed by depositing silicon nitride or silicon nitride oxide by a plasma CVD method at or below 350° C. By supplying hydrogen into the semiconductor layers 151 and 152, defects which turn into trapping centers in the semiconductor layers 151 and 152 or at the interface between the semiconductor layers 151 and 152 and the insulating layer 154 can be effectively compensated.

After that, an interlayer insulating layer 169 is formed. The interlayer insulating layer 169 can be formed in a single-layer structure or a stacked-layer structure by using an insulating film formed of an inorganic material, such as a silicon oxide film or a BPSG (borophosphosilicate glass) film, or an organic resin film formed of polyimide, acrylic, or the like. Then, contact holes are formed through the interlayer insulating layer 169 and wirings 170 are formed as shown in FIG. 4. The wirings 170 can be formed using a conductive film with a three-layer structure in which a low-resistance metal film such as an aluminum film or an aluminum-alloy film is sandwiched between barrier metal films. The barrier metal films can be formed using metal films which include molybdenum, chromium, titanium, and/or the like.

Through the above steps, a semiconductor device having the n-channel TFT and the p-channel TFT can be manufactured. Since the metal elements included in the channel formation regions are gettered into the gettering site regions, the effect of metal contamination caused in a process of manufacturing a semiconductor device can be suppressed. Therefore, the ion beam irradiation by an ion doping method in which mass separation is not performed can be carried out positively in the step of forming the damaged region as one of steps of manufacturing the SOI substrate.

In the method of manufacturing a semiconductor device shown in FIGS. 1A to 10, FIGS. 2A to 2D, FIGS. 3A to 3C, and FIG. 4, the donors and acceptors are added to the gettering site regions in a different step from the step of adding the Group 18 element; however, these steps can be performed at the same time. For example, in a case of adding argon and phosphorus serving as a donor to the semiconductor layers at the same time, a mixed gas of Ar, $H_2$, and $PH_3$ (phosphine) or a mixed gas of Ar and $PH_3$ may be used as a source gas. In a case of adding argon and boron serving as an acceptor to the semiconductor layers at the same time, a mixed gas of Ar, $H_2$, and $B_2H_6$ (diborane) or a mixed gas of Ar and $B_2H_6$ may be used as a source gas.

(Embodiment Mode 2)

This embodiment mode will explain a method of forming a gettering site region in a different region from that shown in Embodiment Mode 1.

In Embodiment Mode 1, the Group 18 element is added in order to form a distortion in the gettering site region. The increase in the additive amount of the Group 18 element will cause the gettering site region to be distorted largely, which results in that an effect of gettering the metal elements is enhanced further. Moreover, since the gettering site region is formed in the semiconductor layer which constitutes a part of the semiconductor element, it is preferable to perform recrystallization by heat treatment of a gettering process. However, if the concentration of the Group 18 element in the gettering site region is too high, the lattice remains distorted depending on the process temperature of later heat treatment, which makes the recrystallization difficult in some cases. Therefore, there is a risk that the sheet resistance of the gettering site region cannot be sufficiently decreased, and problems that, for example, the contact resistance with wiring gets higher become remarkable.

Therefore, this embodiment mode will explain a method of forming a gettering site region which can sufficiently perform a gettering operation and more surely makes an impurity region low-resistant, by heat treatment for the gettering.

Figure 5A:
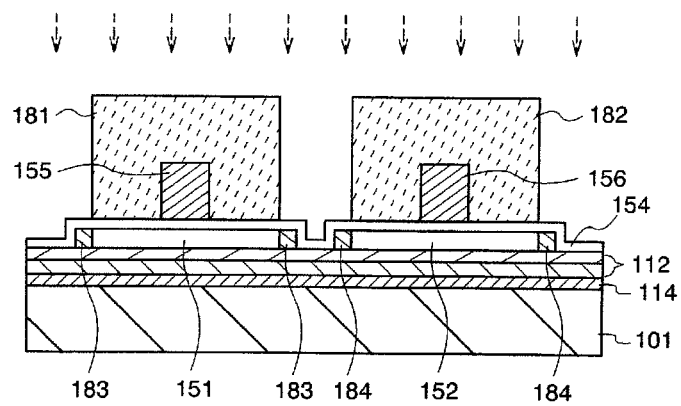
FIGS. 5A to 5C are cross-sectional views for describing a method of manufacturing a semiconductor device, after the step of FIG. 2B.

The steps explained in Embodiment Mode 1 with reference to FIGS. 1A to 1G and FIGS. 2A and 2B are performed. Next, in order to form gettering site regions, a resist 181 is formed over the semiconductor layer 151 and a resist 182 is formed over the semiconductor layer 152, as shown in FIG. 5A. The Group 18 elements are added to the semiconductor layers 151 and 152 by using the resists 181 and 182 as masks, whereby gettering site regions 183 are formed in the semiconductor layer 151 and gettering site regions 184 are formed in the semiconductor layer 152 (see FIG. 5A). The concentration of the Group 18 element in each of the gettering site regions 183 and 184 can be set in the range of from $1\times10^{18}$ atoms/cm$^3$ to $1\times10^{22}$ atoms/cm$^3$ inclusive, and is preferably in the range of from $1\times10^{20}$ atoms/cm$^3$ to $5\times10^{21}$ atoms/cm$^3$ inclusive.

This step can be performed by an ion implantation method or an ion doping method as in the step of FIG. 3A. The gettering site regions 183 and 184 are formed so as not to include a region which will be in contact with wirings. For that purpose, the shapes of the resists 181 and 182 are adjusted. When the gettering site regions 183 and 184 are formed in such regions, the electrical characteristics of TFTs are not affected even if the degree of recrystallization of the gettering site regions 183 and 184 is not enough.

Figure 5B:
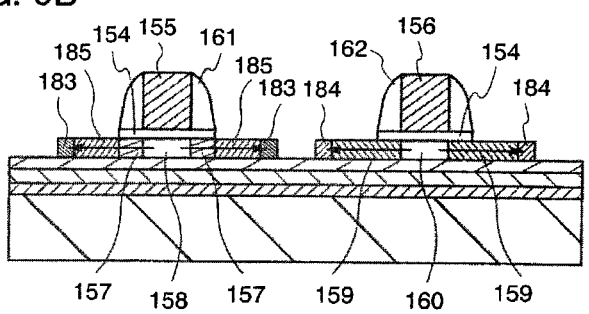

Then, the step of adding the donors and acceptors shown in FIG. 2C, the step of forming the sidewall insulating layers shown in FIG. 2D, and the step of adding the donors shown in FIG. 3B are performed, whereby a structure shown in FIG. 5B is obtained. The n-type low-concentration impurity regions 157, the channel formation region 158, n-type high-concentration impurity regions 185, and the gettering site regions 183 are formed in the semiconductor layer 151 of an n-channel TFT. The gettering site regions 183 have n-type conductivity because donors are added in the step of forming the high-concentration impurity regions 185. On the other hand, the channel formation region 160, the p-type high-concentration impurity regions 159, and the gettering site regions 184 are formed in the semiconductor layer 152 of a p-channel TFT. The gettering site regions 184 have p-type conductivity because acceptors are added in the step of forming the high-concentration impurity regions 159.

Then, heat treatment is performed at temperatures in the range of from 550° C. to 700° C. inclusive for 1 to 24 hours to activate the donors added to the semiconductor layer 151 and the acceptors added to the semiconductor layer 152. At the same time, the metal elements contained in the channel formation regions 158 and 160 are separated out or diffuse into the gettering site regions 183 and 184, respectively so as to be captured in the gettering site regions 183 and 184. Thus, the concentration of the metal elements in the channel formation regions 158 and 160 is decreased.

Figure 5C:
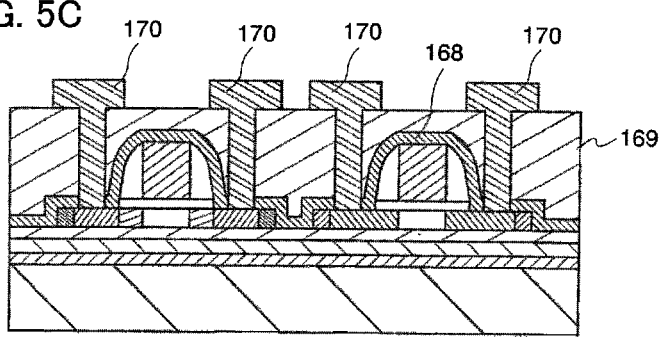

Subsequently, steps similar to the steps described with reference to FIG. 4 are performed, whereby the insulating layer 168 containing hydrogen, the interlayer insulating layer 169, and the wirings 170 are formed as shown in FIG. 5C.

Through the above steps, a semiconductor device including the n-channel transistor and the p-channel transistor each of which has the channel formation region with reduced concentration of the metal elements can be manufactured.

(Embodiment Mode 3)

This embodiment mode will explain an example of a method of manufacturing a semiconductor device. In this embodiment mode, a semiconductor with phosphorus added and a semiconductor with phosphorus and boron added are used for forming gettering site regions.

First, as explained in Embodiment Mode 1, the steps shown in FIGS. 2A to 2D are performed. The n-type low-concentration impurity regions 157 are formed in the semiconductor layer 151 and the p-type high-concentration impurity regions 159 are formed in the semiconductor layer 152.

Figure 6A:
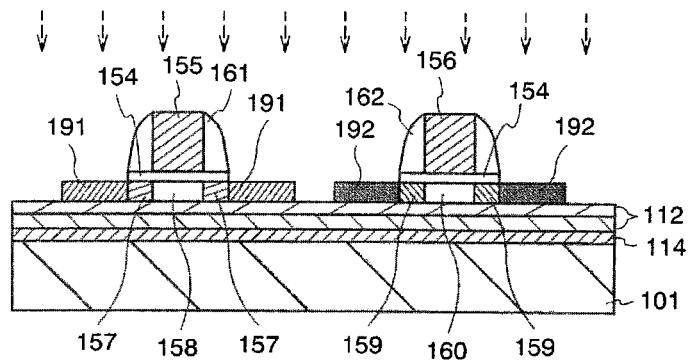
FIGS. 6A to 6C are cross-sectional views for describing a method of manufacturing a semiconductor device, after the step of FIG. 2D.

As shown in FIG. 6A, donors are simultaneously added to the semiconductor layer 151 and the semiconductor layer 152 by an ion doping method or an ion implantation method. This step of adding the donors is performed in order to form gettering site regions in the semiconductor layers 151 and 152. The donors may be phosphorus or arsenic. In this step, the gate electrode 155 and the sidewall insulating layers 161 serve as masks, and n-type high-concentration impurity regions 191 are formed in the semiconductor layer 151. In order for the high-concentration impurity regions 191 to function as gettering site regions, the concentration of phosphorus and arsenic in total contained in the high-concentration impurity regions 191 is set in the range of $1\times10^{20}$ atoms/cm$^3$ to $1\times10^{22}$ atoms/cm$^3$ inclusive. By addition of phosphorus and/or arsenic to the semiconductor layer 151 within this concentration range, the high-concentration impurity regions 191 can also function as a source region and a drain region.

The donors are added to the semiconductor layer 152 on the other. Through this step, the gate electrode 156 and the sidewall insulating layers 162 serve as masks, and p-type high-concentration impurity regions 192 are formed in the semiconductor layer 152. In order for the high-concentration impurity regions 192 not to have an opposite conductivity, i.e., n-type conductivity due to addition of the donors, the acceptors are added to the p-type high-concentration impurity regions 159 in the step of FIG. 2C at a concentration of 1.5 to 3 times higher than that of the donors added in the step of FIG. 6A. When the p-type high-concentration impurity regions 192 containing phosphorus and/or arsenic at a predetermined concentration in the semiconductor layer 152 of the p-channel TFT, the metal elements can be gettered into the high-concentration impurity regions 192 by heat treatment at or below 700° C.

Figure 6B:
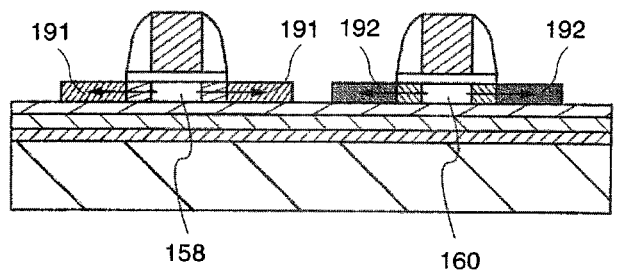

Subsequently, heat treatment for activating the donors and acceptors and for gettering is performed. FIG. 6B is a drawing for explaining a step of the heat treatment. The heat treatment is performed at temperatures in the range of from 450° C. to 850° C. inclusive for 1 to 24 hours, whereby the donors added to the semiconductor layer 151 and the acceptors and donors added to the semiconductor layer 152 are activated. At the same time, the metal elements contained in the channel formation regions 158 and 160 are separated out or diffuse into the high-concentration impurity regions that are the gettering site regions 191 and 192, respectively so as to be captured in these high-concentration impurity regions 191 and 192. That is to say, the concentration of the metal elements in the channel formation regions 158 and 160 can be decreased by this heat treatment. This heat treatment is performed preferably at temperatures in the range of from 500° C. to 700° C. inclusive.

Figure 6C:
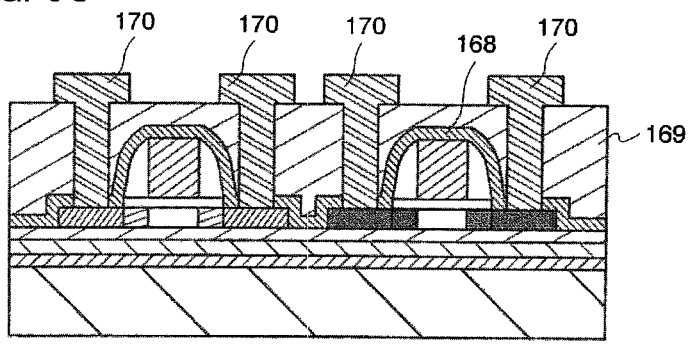

Next, steps similar to the steps described with reference to FIG. 4 are performed, whereby the insulating layer 168 containing hydrogen, the interlayer insulating layer 169, and the wirings 170 are formed as shown in FIG. 6C. Through the above steps, a semiconductor device having the n-channel TFT and the p-channel TFT can be manufactured. Since the process is performed to getter the metal elements, which are included in the channel formation region, into the gettering site regions, the effect of metal contamination caused in a process of manufacturing a semiconductor device can be suppressed. Therefore, the ion beam irradiation by an ion doping method in which mass separation is not performed can be carried out positively in the step of forming the damaged region as one of steps of manufacturing the SOI substrate.

(Embodiment Mode 4)

This embodiment mode will explain a method of manufacturing a semiconductor device with the use of the SOI substrate 131. With reference to FIGS. 7A to 7D and FIGS. 8A to 8C, description will hereinafter be made on a method of manufacturing an n-channel thin film transistor and a p-channel thin film transistor, as a method of manufacturing a semiconductor device, like in Embodiment Mode 1. In the method of manufacturing a semiconductor device in Embodiment Modes 1 to 3, the step of forming the gettering site region is performed after isolating the semiconductor layer of the SOI substrate for each element by etching. In contrast to this, a gettering site region is formed in a semiconductor layer before being isolated for each element in the manufacturing method of this embodiment mode.

Figure 7A:
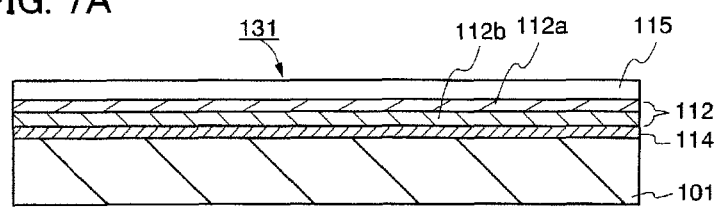
FIGS. 7A to 7D are cross-sectional views for describing a method of manufacturing a semiconductor device, after the step of FIG. 1G.

FIG. 7A is a cross-sectional view of the SOI substrate 131 manufactured by the method described with reference to FIGS. 1A to 1G The semiconductor layer 115 is fixed over the base substrate 101 with the insulating layer 112 and the bonding layer 114 interposed therebetween. The insulating layer 112 has a two-layer structure of the insulating film 112a and the insulating film 112b.

Figure 7B:
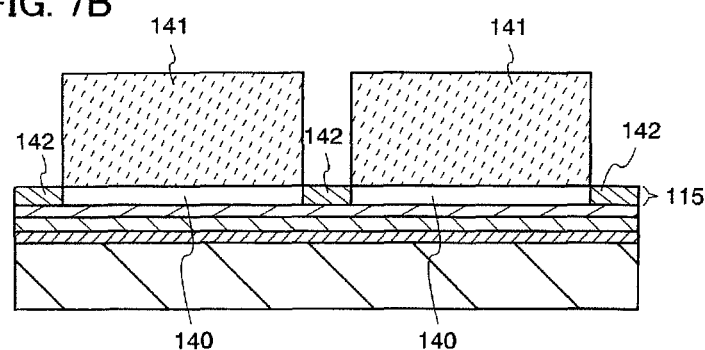

Next, gettering site regions are formed in the semiconductor layer 115. FIG. 7B is a cross-sectional view for describing a step of forming the gettering site regions. The gettering site regions are formed so as not to include portions where semiconductor elements will be formed. As shown in FIG. 7B, element formation regions 140 of the semiconductor layer 115 are covered with resists 141 and impurity elements are added by an ion doping method or an ion implantation method, thereby forming gettering site regions 142. The gettering site regions 142 can be formed by any of the following four methods.

In the first method, the gettering site regions 142 are formed by adding a Group 18 element to the semiconductor layer 115. As the Group 18 element, one kind or plural kinds of elements selected from helium (He), neon (Ne), argon (Ar), krypton (Kr), or xenon (Xe) can be used. The Group 18 element can be added by an ion implantation method in which mass separation is performed or an ion doping method in which mass separation is not performed. An ion doping method is preferable because tact time can be shortened. The concentration of the Group 18 element in the gettering site regions 142 is preferably set in the range of from $1 \times 10^{18}$ atoms/cm$^3$ to $1 \times 10^{22}$ atoms/cm$^3$ inclusive.

The aim of adding the Group 18 element to the semiconductor layer 115 is to form gettering sites in the semiconductor layer 115 by distorting the semiconductor layer 115. There are two factors that cause the distortion by addition of the Group 18 element. One is the formation of dangling bonds in crystals by adding the Group 18 element, and the other is the addition of the Group 18 element between crystal lattices.

In the second method, an n-type impurity region is formed by adding phosphorus to the semiconductor layer 115. Phosphorus may be replaced by arsenic. Alternatively, both phosphorus and arsenic may be added. The concentration of phosphorus and arsenic in total in the gettering site region is set in the range of from $1 \times 10^{20}$ atoms/cm$^3$ to $1 \times 10^{22}$ atoms/cm$^3$ inclusive.

In the third method, an n-type impurity region which contains the Group 18 element is formed by adding the Group 18 element and phosphorus to the semiconductor layer 115. Phosphorus may be replaced by arsenic; alternatively, both phosphorus and arsenic may be added. The concentration of phosphorus and arsenic in total in the gettering site region is set in the range of from $1 \times 10^{20}$ atoms/cm$^3$ to $1 \times 10^{22}$ atoms/cm$^3$ inclusive. Moreover, the concentration of the Group 18 element in each of the gettering site regions 142 is preferably set in the range of from $1 \times 10^{18}$ atoms/cm$^3$ to $1 \times 10^{22}$ atoms/cm$^3$ inclusive, and more preferably set in the range of from $1 \times 10^{20}$ atoms/cm$^3$ to $5 \times 10^{21}$ atoms/cm$^3$ inclusive. For example, when phosphorus and argon are added to the semiconductor layer 115 at the same time, a mixed gas of Ar, H$_2$, and PH$_3$ or a mixed gas of Ar and PH$_3$ may be used as a source gas.

In the fourth method, phosphorus and boron are added to the semiconductor layer in such a way that boron is added more than phosphorus so as to form an impurity region imparting p-type conductivity. Phosphorus may be replaced by arsenic. The gettering site region can include phosphorus and arsenic in total at a concentration of from $1 \times 10^{19}$ atoms/cm$^3$ to $1 \times 10^{21}$ atoms/cm$^3$ inclusive. The concentration of boron is 1.5 times to 3 times higher than the concentration of phosphorus and arsenic in total included in the gettering site region.

Figure 7C:
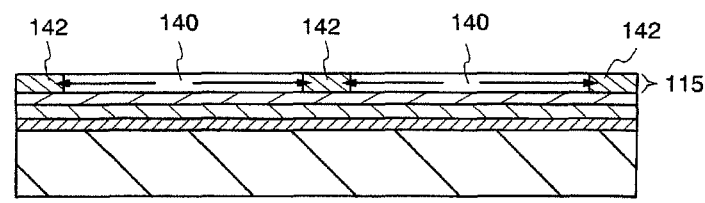

After removing the resist 141, heat treatment for gettering is performed. FIG. 7C is a drawing for explaining a step of the heat treatment. Through heat treatment at temperatures in the range of from 450° C. to 850° C. inclusive for 1 to 24 hours, the metal elements included in the semiconductor layer 115 are captured in the gettering site regions 142. Through this heat treatment, the metal elements included in the element formation regions 140 not including the impurity elements are separated out or diffuse so as to be captured in the gettering site regions 142. As a result, the concentration of the metal elements in the element formation regions 140 can be decreased. This heat treatment is preferably performed at temperatures in the range of from 500° C. to 700° C. inclusive.

Next, the semiconductor layer 115 is isolated for each element by etching, thereby forming the semiconductor layers 151 and 152. The semiconductor layer 151 constitutes a part of an n-channel TFT and the semiconductor layer 152 constitutes a part of a p-channel TFT. The gettering site regions 142 are removed by this etching process, and the semiconductor layers 151 and 152 are formed so as not to include the gettering site regions 142 and boundaries between the gettering site regions 142 and the element formation regions 140.

As described in Embodiment Mode 1, the analysis results of FIGS. 16 to 19 indicate that the metal contamination of the semiconductor layer of the SOI substrate becomes remarkable due to the ion irradiation by an ion doping method in forming the damaged region. As in Embodiment Modes 1 to 3, this embodiment mode is to solve this metal contamination, and gettering is performed in a process of manufacturing a semiconductor element, after manufacturing the SOI substrate. Therefore, since the effect of metal contamination on TFTs can be suppressed in this embodiment mode, the ion irradiation by an ion doping method can be carried out positively in forming the damaged region 113.

Figure 7D:
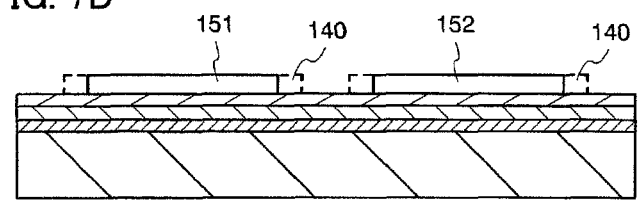

The semiconductor layers 151 and 152 are formed as shown in FIG. 7D, after isolating the semiconductor layer 115 of the SOI substrate for each element by etching. The semiconductor layer 151 constitutes a part of an n-channel TFT, whereas the semiconductor layer 152 constitutes a part of a p-channel TFT. Next, the steps shown in FIGS. 2B to 2D are performed as in Embodiment Mode 1.

Figure 8A:
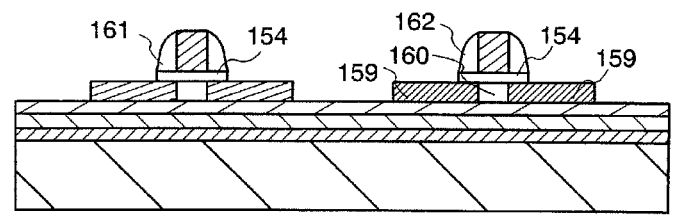
FIGS. 8A to 8C are cross-sectional views for describing a method of manufacturing a semiconductor device, after the step of FIG. 7D.

FIG. 8A is a cross-sectional view of a semiconductor device on which the step of FIG. 2D has been performed. The gate electrodes 155 and 156 are formed over the semiconductor layers 151 and 152, respectively with the insulating layer 154 interposed therebetween. The sidewall insulating layers 161 and 162 are formed in contact with side surfaces of the gate electrodes 155 and 156, respectively. In the semiconductor layer 151, the n-type low-concentration impurity regions 157 and the channel formation region 158 are formed. In the semiconductor layer 152, the p-type high-concentration impurity regions 159 and the channel formation region 160 are formed.

Figure 8B:
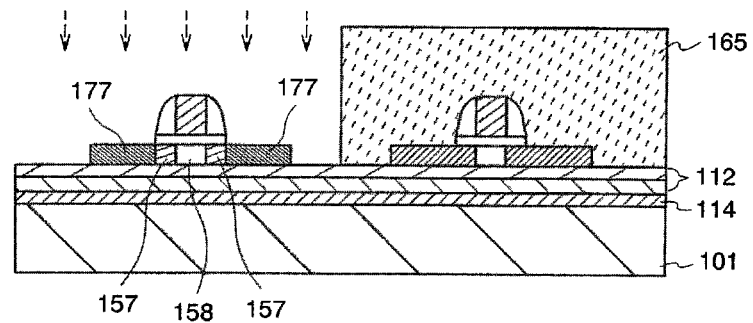

Next, the semiconductor layer 152 is covered with the resist 165, as shown in FIG. 8B. In order to form the high-concentration impurity regions functioning as a source region and a drain region in the semiconductor layer 151, a large dosage of donors are added to the semiconductor layer 151 by an ion implantation method or an ion doping method. The gate electrode 155 and the sidewall insulating layers 161 serve as masks, and n-type high-concentration impurity regions 177 are formed. The n-type high-concentration impurity regions 177 function as a source region and a drain region.

The resist 165 is removed, and then heat treatment in a furnace or laser light irradiation is performed to activate the donors and acceptors. After that, an n-channel TFT and a p-type TFT are manufactured through the steps shown with reference to FIG. 4, as in Embodiment Mode 1.

Figure 8C:
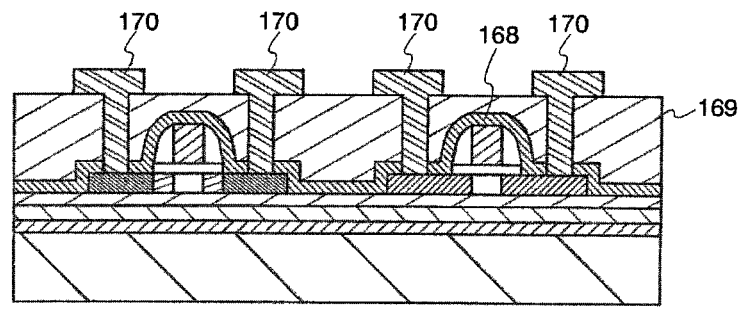

FIG. 8C is a cross-sectional view of a semiconductor device having the n-channel TFT and the p-channel TFT. In this embodiment mode, since the metal elements included in the semiconductor layer of the TFT are gettered into the gettering site regions, the effect of metal contamination caused in a process of manufacturing the semiconductor device can be suppressed. Therefore, the ion irradiation by an ion doping method in which mass separation is not performed can be carried out positively in the step of forming the damaged region as one of steps of manufacturing the SOI substrate.

(Embodiment Mode 5)

This embodiment mode will explain a method of manufacturing an SOI substrate, which is different from the method described in Embodiment Mode 1. FIGS. 9A to 9G are cross-sectional views showing an example of a method of manufacturing an SOI substrate.

As shown in FIG. 9A, the base substrate 101 serving as a base substrate of an SOI substrate is prepared. The base substrate 101 is cleaned and then an insulating layer 102 is formed on its top surface to a thickness of from 10 nm to 400 nm inclusive. The insulating layer 102 can have a single-layer structure or a multilayer structure including two or more layers. Like the insulating layer 112 in FIG. 1C, the insulating layer 102 can include an insulating film containing silicon or germanium in its composition, such as a silicon oxide film, a silicon nitride film, a silicon oxynitride film, a silicon nitride oxide film, a germanium oxide film, a germanium nitride film, a germanium oxynitride film, or a germanium nitride oxide film. Moreover, an insulating film including a metal oxide such as aluminum oxide, tantalum oxide, or hafnium oxide; an insulating film including a metal nitride such as aluminum nitride; an insulating film including a metal oxynitride such as aluminum oxynitride; or an insulating film including a metal nitride oxide such as aluminum nitride oxide can be used.

When the base substrate 101 is a substrate including an impurity which decreases the reliability of the semiconductor device, such as alkali metal or alkaline earth metal, the insulating layer 102 preferably includes at least one layer capable of preventing diffusion of such impurity from the base substrate 101 to the semiconductor layer of the SOI substrate. Therefore, like the insulating layer 112, the insulating layer 102 is preferably formed so as to include at least one layer of a silicon nitride film, a silicon nitride oxide film, an aluminum nitride film, an aluminum nitride oxide film, or the like.

The insulating layer 102 can be formed similar to the insulating layer 112; however, when the insulating layer 102 has a two-layer structure, the order of stacking layers is preferably opposite to that of the insulating layer 112. In other words, a film with a high blocking effect for preventing impurity diffusion, such as a silicon nitride film, a silicon nitride oxide film, an aluminum nitride film, or an aluminum nitride oxide film is formed as an insulating film 102a, which is the lower layer, to a thickness of from 5 nm to 200 nm inclusive. As an insulating film 102b, which is the upper layer, a film with an effect of relieving internal stress of the insulating film 102a is formed.

For example, as a combination of the insulating film 102a and the insulating film 102b, the following combinations can be given: a silicon nitride film and a silicon oxide film, a silicon nitride film and a silicon oxynitride film, a silicon nitride oxide film and a silicon oxide film, and a silicon nitride oxide film and a silicon oxynitride film. In each of these combinations, the former film corresponds to the insulating film 102a and the latter film corresponds to the insulating film 102b.

In this embodiment mode, the insulating layer 102 is formed so as to function as a blocking film. As the insulating film 102a, which is the lower layer, a silicon nitride oxide film is formed by a plasma CVD method with the use of $SiH_4$, $N_2O$, and $NH_3$ as a process gas. As the insulating film 102b, which is the upper layer, a silicon oxynitride film is formed by a plasma CVD method with the use of $SiH_4$ and $N_2O$ as a process gas.

After forming the insulating layer 102, a bonding layer 104 is formed over the insulating layer 102, as shown in FIG. 9A. This bonding layer 104 can be formed in a similar manner to the bonding layer 114 formed over the semiconductor substrate 111.

FIG. 9B is a cross-sectional view of the semiconductor substrate 111. After cleaning the semiconductor substrate 111, a protection film 117 is formed on a surface of the semiconductor substrate 111, as shown in FIG. 9C. The protection film 117 is formed with aims of preventing the semiconductor substrate 111 from being contaminated by impurities such as metal in an ion irradiation step for forming a damaged region, preventing the semiconductor substrate 111 from being damaged due to shock of ions at the irradiation, and the like. This protection film 117 can be formed by depositing silicon oxide, silicon nitride, silicon nitride oxide, silicon oxynitride, or the like by a CVD method or the like. Alternatively, the protection film 117 can be formed by oxidizing or nitriding the semiconductor substrate 111.

FIG. 9D is a cross-sectional view showing a step of forming the damaged region. Like the step shown in FIG. 1D, a damaged region 113 is formed in the semiconductor substrate 111. After forming the damaged region 113, the protection film 117 is removed as shown in FIG. 9E. After removing the protection film 117, a bonding layer 114 can be formed in a similar manner to the step shown in FIG. 1E. Moreover, the insulating layer 112 and the bonding layer 114 can be formed. Alternatively, the bonding layer 114 can be formed over the protection film 117 with the protection film 117 left.

FIG. 9F is a cross-sectional view for explaining a bonding step, which shows a state where the base substrate 101 and the semiconductor substrate 111 are attached to each other. This bonding step can be performed in a similar manner to the bonding step explained with reference to FIG. 1F, and the semiconductor substrate 111 and the bonding layer 104 are bonded to each other by having the semiconductor substrate 111 and the bonding layer 104 in close contact with each other at room temperature.

FIG. 9G is a cross-sectional view for explaining a separation step of separating the semiconductor layer 115 from the semiconductor substrate 111. The separation step of this embodiment mode can be performed in a similar manner to the separation step explained with reference to FIG. 1G After bonding the semiconductor substrate 111 and the bonding layer 104 to each other, the semiconductor substrate 111 is heated at temperatures ranging from 400° C. to 700° C. inclusive. Also in this embodiment mode, heat treatment is preferably performed at temperatures ranging from 70° C. to 300° C. inclusive before the heat treatment at or above 400° C. so as to increase the bonding force between the semiconductor substrate 111 and the bonding layer 104 at their bonded interface.

Through the separation step shown in FIG. 9G, an SOI substrate 132 in which the semiconductor layer 115 is attached to the base substrate 101 is manufactured. The SOI substrate 132 has a multilayer structure in which the insulating layer 102, the bonding layer 104, and the semiconductor layer 115 are stacked in this order, the semiconductor layer 115 and the bonding layer 104 being bonded to each other. After the separation step, it is preferable to recrystallize the semiconductor layer 115 by laser irradiation in order to decrease crystal defects. Moreover, the surface of the semiconductor layer 115 is preferably polished by a CMP apparatus in order to remove the damage of the surface of the semiconductor layer 115 to flatten the surface.

With the use of the SOI substrate 132 manufactured in accordance with the method of this embodiment mode, a semiconductor device can be manufactured by using the method described in any of Embodiment Modes 1 to 4.

(Embodiment Mode 6)

In the process for manufacturing the SOI substrate, which has been described with reference to FIGS. 1A to 1G, FIGS. 2A to 2D, FIGS. 3A to 3C, FIG. 4, FIGS. 5A to 5C, FIGS. 6A to 6C, FIGS. 7A to 7D, FIGS. 8A to 8C, and FIGS. 9A to 9G various kinds of glass substrates such as an alkali-free glass substrate can be used as the base substrate 101. Therefore, with the use of a glass substrate as the base substrate 101, a large-area SOI substrate with a side of more than one meter can be manufactured. With a plurality of semiconductor elements formed using such a large-area SOI substrate, a liquid crystal display device or an electroluminescent display device can be manufactured. In addition to such display devices, a variety of semiconductor devices such as solar cells, photo ICs, and semiconductor memory devices can be manufactured by using SOI substrates.

Although Embodiment Modes 1 to 4 explain the method of manufacturing a TFT as an example of a method of manufacturing a semiconductor device, a semiconductor device can be manufactured so as to have high added value by forming a variety of semiconductor elements such as a capacitor and a resistor together with the TFT. This embodiment mode will explain specific modes of semiconductor devices with reference to drawings.

Figure 10:
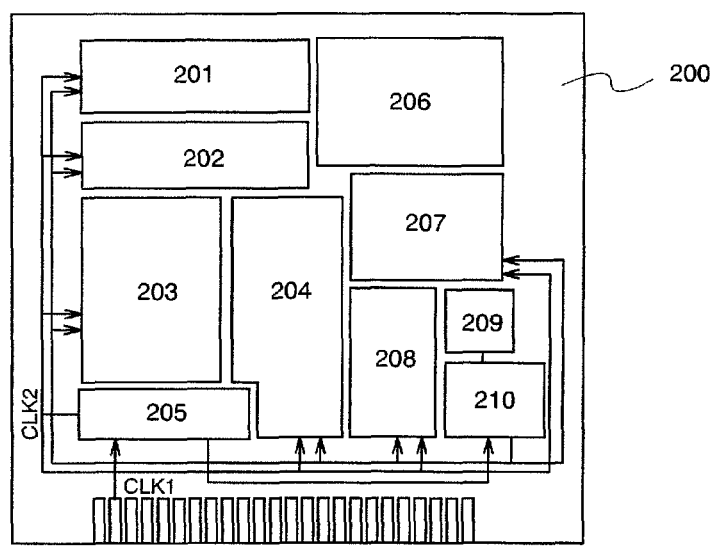
FIG. 10 is a block diagram for showing a structure of a microprocessor.

First, a microprocessor will be explained as an example of a semiconductor device. FIG. 10 is a block diagram showing an example of a structure of a microprocessor 200.

The microprocessor 200 includes an arithmetic logic unit (also called ALU) 201, an arithmetic logic unit controlling portion (ALU controller) 202, an instruction decoder 203, an interrupt controlling portion (interrupt controller) 204, a timing controlling portion (timing controller) 205, a register 206, a register controlling portion (register controller) 207, a bus interface (bus I/F) 208, a read only memory (ROM) 209, and a ROM interface 210.

An instruction input to the microprocessor 200 via the bus interface 208 is input to the instruction decoder 203 and decoded therein; then, the decoded instruction is input to the ALU controller 202, the interrupt controller 204, the register controller 207, and the timing controller 205. The ALU controller 202, the interrupt controller 204, the register controller 207, and the timing controller 205 perform various controls based on the decoded instruction.

The ALU controller 202 generates signals for controlling an operation of the ALU 201. While the microprocessor 200 is executing a program, the interrupt controller 204 judges an interrupt request from an external input/output device or a peripheral circuit based on its priority or a mask state, and processes the interrupt request. The register controller 207 generates an address of the register 206, and reads/writes data from/to the register 206 in accordance with the state of the microprocessor 200. The timing controller 205 generates signals for controlling when to drive the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1. As shown in FIG. 10, the internal clock signal CLK2 is input to another circuit.

Figure 11:
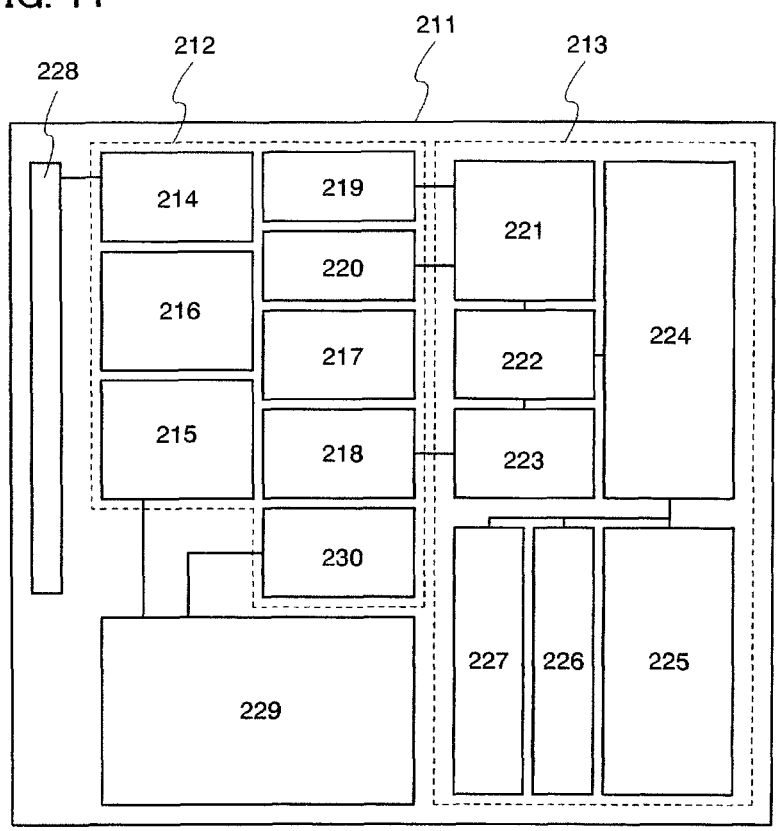
FIG. 11 is a block diagram for showing a structure of an RFCPU.

Next, an example of a semiconductor device having a function of transmitting and receiving data without contact and also having an arithmetic function will be described with reference to FIG. 10. FIG. 11 is a block diagram showing an example of a structure of such a semiconductor device. The semiconductor device shown in FIG. 11 can be called a computer which operates to transmit and receive signals to and from an external device through wireless communication (hereinafter the computer is referred to as an RFCPU).

An RFCPU 211 has an analog circuit portion 212 and a digital circuit portion 213, as shown in FIG. 11. The analog circuit portion 212 includes a resonant circuit 214 having a resonant capacitor, a rectifier circuit 215, a constant voltage circuit 216, a reset circuit 217, an oscillation circuit 218, a demodulation circuit 219, a modulation circuit 220, and a power supply control circuit 230. The digital circuit portion 213 includes an RF interface 221, a control register 222, a clock controller 223, a CPU interface 224, a central processing unit (CPU) 225, a random access memory (RAM) 226, and a read only memory (ROM) 227.

The operation of the RFCPU 211 is briefly described below. A signal received by an antenna 228 causes induced electromotive force at the resonant circuit 214. The induced electromotive force is stored in a capacitor portion 229 via the rectifier circuit 215. The capacitor portion 229 is preferably formed using a capacitor such as a ceramic capacitor or an electric double layer capacitor. The capacitor portion 229 is not necessarily formed over the same substrate as the RFCPU 211 and may be incorporated into the RFCPU 211 as a component.

The reset circuit 217 generates a signal that resets the digital circuit portion 213 to be initialized. For example, the reset signal 217 generates, as a reset signal, a signal that rises with delay after increase in the power supply voltage. The oscillation circuit 218 changes the frequency and the duty ratio of a clock signal in accordance with a control signal generated by the constant voltage circuit 216. The demodulation circuit 219 is a circuit which demodulates received signals and the modulation circuit 220 is a circuit which modulates data for transmission.

The demodulation circuit 219 having a low pass filter, for example, binarizes received signals of an amplitude shift keying (ASK) system based on changes in amplitude of the signals. The modulation circuit 220 changes the amplitude of transmission signals of an amplitude shift keying (ASK) system to be transmitted; therefore, the modulation circuit 220 changes the resonance point of the resonant circuit 214, thereby changing the amplitude of communication signals.

The clock controller 223 generates a control signal for changing the frequency and the duty ratio of the clock signal in accordance with the power supply voltage or current consumption in the central processing unit 225. The power supply voltage is monitored by the power supply control circuit 230.

A signal that is input to the RFCPU 211 from the antenna 228 is demodulated by the demodulation circuit 219, and then divided into a control command, data, and the like by the RF interface 221. The control command is stored in the control register 222. The control command includes, reading of data stored in the read only memory 227, writing of data into the random access memory 226, an arithmetic instruction to the central processing unit 225, and the like.

The central processing unit 225 accesses the read only memory 227, the random access memory 226, and the control register 222 via the CPU interface 224. The CPU interface 224 has a function of generating an access signal for any one of the read only memory 227, the random access memory 226, or the control register 222 based on an address requested by the central processing unit 225.

As an arithmetic method of the central processing unit 225, a method may be employed in which the read only memory 227 stores an OS (operating system) and a program is read out and executed at the time of starting operation. Alternatively, a method may be employed in which a circuit dedicated to arithmetic is formed and an arithmetic process is conducted using hardware. Further alternatively, a method in which both hardware and software are used can be employed as this arithmetic method. In this method, a part of an arithmetic process is conducted in a circuit dedicated to arithmetic and the rest of the arithmetic process is conducted by the central processing unit 225 by using a program.

Next, a display device as a semiconductor device will be explained with reference to FIG. 12, FIGS. 13A and 13B, and FIGS. 14A and 14B.

A large-area glass substrate called a mother glass, which is used to manufacture a display panel, can be used as a base substrate of an SOI substrate. FIG. 12 is a front view of an SOI substrate which uses a mother glass as the base substrate 101.

As shown in FIG. 12, a plurality of semiconductor layers 302 separated form semiconductor substrates are attached to a mother glass 301. In order to cut out a plurality of display panels from the mother glass 301, the semiconductor layers 302 are preferably bonded within regions 310 where the display panels are formed (hereinafter each region is referred to as a display panel formation region 310). The display panel includes a scanning line driver circuit, a signal line driver circuit, and a pixel portion. Therefore, the semiconductor layer 302 is bonded in a region where these are formed (a scanning line driver circuit formation region 311, a signal line driver circuit formation region 312, and a pixel formation region 313) in the display panel formation region 310.

Figure 13A:
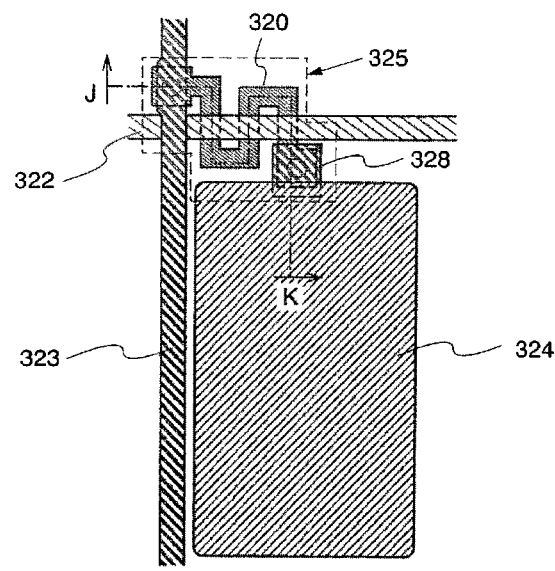
FIG. 13A is a top view of a pixel of a liquid crystal display device.
Figure 13B:
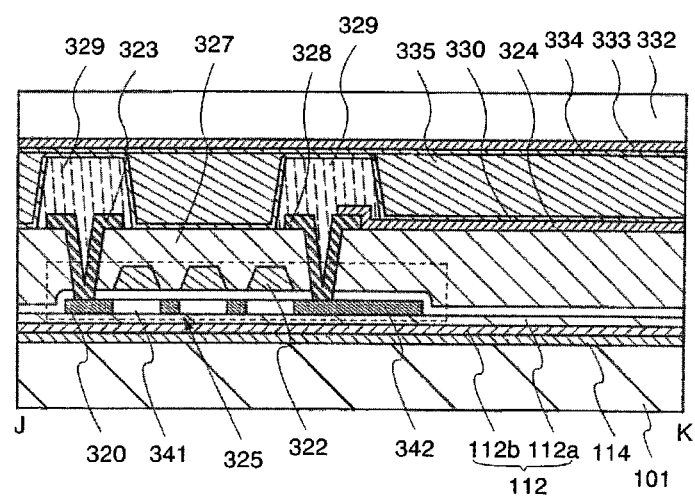
FIG. 13B is a cross-sectional view taken along a line J-K of FIG. 13A.

FIGS. 13A and 13B are drawings for explaining the liquid crystal display device manufactured by the method of Embodiment Mode 1. FIG. 13A is a top view of a pixel of the liquid crystal display device and FIG. 13B is a cross-sectional view along a line J-K of FIG. 13A.

In FIG. 13A, a semiconductor layer 320 is a layer formed using the semiconductor layer 302 attached to the SOI substrate and constitutes a part of a TFT 325 of a pixel. The TFT 325 is manufactured by the method of Embodiment Mode 1. Needless to say, the TFT 325 can also be manufactured by any of the methods of Embodiment Modes 2 to 4.

As shown in FIG. 13A, the pixel includes the semiconductor layer 320, a scanning line 322 intersecting with the semiconductor layer 320, a signal line 323 intersecting with the scanning line 322, a pixel electrode 324, and an electrode 328 which electrically connects the pixel electrode 324 with the semiconductor layer 320.

As shown in FIG. 13B, the bonding layer 114 and the insulating layer 112 are stacked over the base substrate 101. The semiconductor layer 320 of the TFT 325 is provided over the insulating layer 112. The base substrate 101 is the mother glass 301 which has been divided. The semiconductor layer 320 is a layer formed by etching the semiconductor layer of the SOI substrate so that the layer is isolated for each element. Here, channel formation regions 341 and gettering site regions 342 are formed in the semiconductor layer 320. The gettering site regions 342 are each formed as an n-type high-concentration impurity region to which a donor and a Group 18 element are added. A gate electrode of the TFT 325 is included in the scanning line 322 and one of a source electrode and a drain electrode of the TFT 325 is included in the signal line 323.

The signal line 323, the pixel electrode 324, and the electrode 328 are provided over the interlayer insulating film 327. Further, column spacers 329 are formed over the interlayer insulating film 327, and an orientation film 330 is formed covering the signal line 323, the pixel electrode 324, the electrode 328, and the column spacers 329. A counter substrate 332 is provided with a counter electrode 333 and an orientation film 334 that covers the counter electrode 333. The column spacers 329 are formed in order to keep space between the base substrate 101 and the counter substrate 332. A liquid crystal layer 335 is formed in the space formed by the column spacers 329. The interlayer insulating film 327 has concavity at the connection portion between the gettering site region 342, and the signal line 323 and the electrode 328 due to the formation of contact holes; therefore, orientation of liquid crystals in the liquid crystal layer 335 is easily disordered at this connection portion. Therefore, the column spacers 329 are formed at the concave portions to prevent the disorder of the orientation of liquid crystals.

Figure 14A:
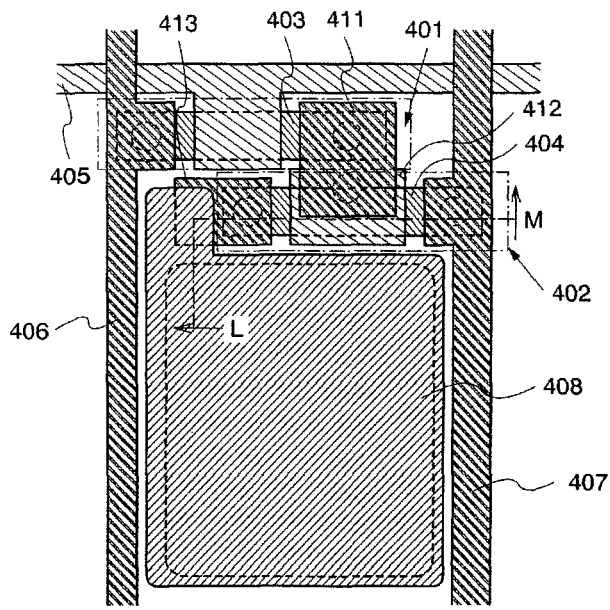
FIG. 14A is a top view of a pixel of an electroluminescent display device.
Figure 14B:
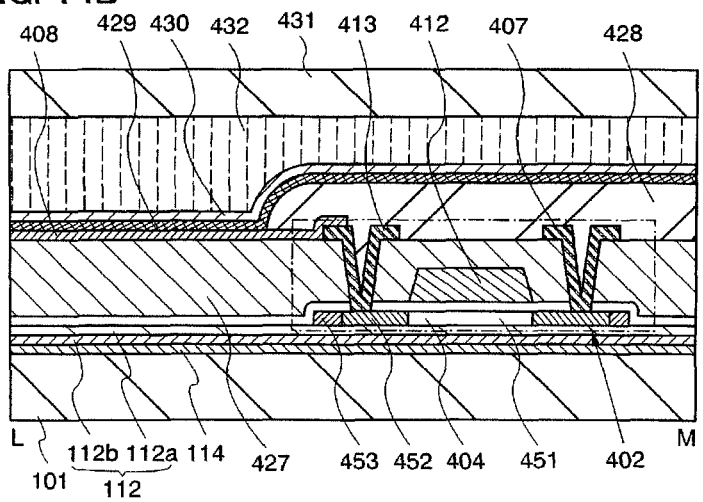
FIG. 14B is a cross-sectional view taken along a line L-M of FIG. 14A.

Next, an electroluminescent display device (hereinafter referred to as an EL display device) will be explained. FIGS. 14A and 14B are drawings for explaining the EL display device manufactured by the method of Embodiment Mode 2. FIG. 14A is a top view of a pixel of the EL display device, and FIG. 14B is a cross-sectional view taken along a line L-M of FIG. 14A.

As shown in FIG. 14A, the pixel includes a selection transistor 401 and a display control transistor 402 each including a TFT, a scanning line 405, a signal line 406, a current supply line 407, and a pixel electrode 408. Each pixel is provided with a light-emitting element having a structure in which a layer including an electroluminescent material (hereinafter this layer is referred to as an EL layer) is sandwiched between a pair of electrodes. One electrode of the light-emitting element is the pixel electrode 408. In this embodiment mode, the SOI substrate 131 (see FIG. 1G) is used. Therefore, as shown in FIG. 14B, the bonding layer 114 and the insulating layer 112 are stacked over the base substrate 101. The semiconductor layer 403 of the selection transistor 401 exists over this insulating layer 112 together with the semiconductor layer 404 of the display control transistor 402.

A gate electrode of the selection transistor 401 is included in the scanning line 405. One of a source electrode and a drain electrode of the selection transistor 401 is included in the signal line 406 while the other is formed as an electrode 411. A gate electrode 412 of the display control transistor 402 is electrically connected to the electrode 411. One of a source electrode and a drain electrode of the display control transistor 402 is formed as an electrode 413 which is electrically connected to the pixel electrode 408 while the other is included in the current supply line 407.

The display control transistor 402 is a p-channel TFT. As shown in FIG. 14B, a channel formation region 451, p-type high-concentration impurity regions 452, and gettering site regions 453 are formed in the semiconductor layer 404. An acceptor is added to each gettering site region 453 in the same step as a step of forming the high-concentration impurity regions 452, and the gettering site regions 453 have p-type conductivity.

An interlayer insulating film 427 is formed covering the gate electrode 412 of the display control transistor 402. The signal line 406, the current supply line 407, the electrodes 411 and 413, and the like are formed over the interlayer insulating film 427. Moreover, the pixel electrode 408 which is electrically connected to the electrode 413 is formed over the interlayer insulating film 427. The pixel electrode 408 is surrounded by a partition wall layer 428, which has an insulating property, at the periphery. An EL layer 429 is formed over the pixel electrode 408, and a counter electrode 430 is formed over the EL layer 429. A counter substrate 431 is provided as a reinforcing plate, and is fixed to the base substrate 101 by a resin layer 432.

The grayscale of the EL display device is controlled by a current drive method by which the luminance of the light-emitting element is controlled by the amount of current and a voltage drive method by which the luminance is controlled by the amount of voltage. The current drive method is difficult to adapt when transistors have very different characteristics for every pixel, and therefore a compensation circuit for compensating variation in characteristics is necessary. When the EL display device is manufactured by using the method of manufacturing a semiconductor device, which includes the gettering step explained in Embodiment Modes 1 to 4, the selection transistor 401 and the display control transistor 402 do not have variation in electrical characteristics for every pixel. Therefore, the current drive method can be employed in controlling the grayscale of the EL display device.

As shown in FIGS. 13A and 13B and FIGS. 14A and 14B, the SOI substrate can be manufactured using a mother glass for display device fabrication, and the display device can be manufactured using this SOI substrate. Moreover, since even the microprocessor as described with reference to FIGS. 10 and 11 can be formed using this SOI substrate, the display device can also have a function of computer. Furthermore, a display device capable of input and output of data without contact can also be manufactured.

That is to say, various electronic appliances can be manufactured by using SOI substrates. The electronic appliances include cameras such as a video camera and a digital camera, a navigation system, a sound reproduction system (such as a car audio system and an audio component), a computer, a game machine, a mobile information terminal (such as a mobile computer, a cellular phone, a mobile game machine, and an electronic book reader), an image reproduction device provided with a recording medium, and the like. It is to be noted that the image reproduction device is provided with a display device for displaying images, and has a function of reproducing audio data and image data stored in a storage medium such as a DVD (digital versatile disc).

Figure 15A:
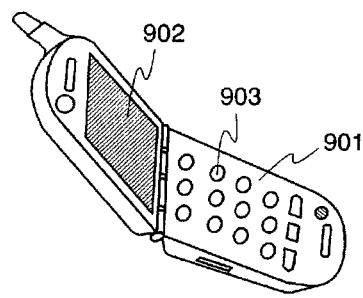
FIG. 15A is an external view of a cellular phone.

Specific modes of the electronic appliances will be explained with reference to FIGS. 15A to 15C. FIG. 15A is an external view illustrating a cellular phone 901. This cellular phone 901 includes a display portion 902, an operation switch 903, and the like. The display portion 902 can have excellent display quality with less display unevenness when the display portion 902 is formed by the liquid crystal display device explained with reference to FIGS. 13A and 13B or with the EL display device explained with reference to FIGS. 14A and 14B.

Figure 15B:
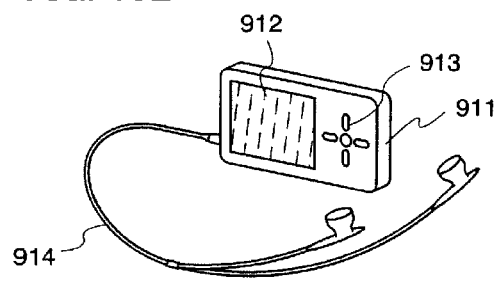
FIG. 15B is an external view of a digital player.

FIG. 15B is an external view illustrating a structure of a digital player 911. The digital player 911 includes a display portion 912, an operation portion 913, an earphone 914, and the like. The earphone 914 can be replaced by a headphone or a wireless earphone. When the display portion 912 is formed by the liquid crystal display device explained with reference to FIGS. 13A and 13B or by the EL display device explained with reference to FIGS. 14A and 14B, the display portion 912 can display high-definition images and a large amount of letter information even in a case where the screen size ranges from about 0.3 to 2 inches.

Figure 15C:
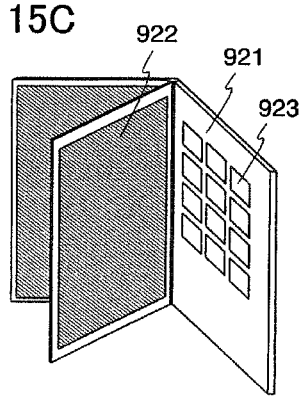
FIG. 15C is an external view of an electronic book reader.

FIG. 15C is an external view of an electronic book reader 921. This electronic book reader 921 includes a display portion 922 and an operation switch 923. The electronic book reader 921 may incorporate a modem or may incorporate the RFCPU shown in FIG. 11 so that information can be transmitted and received wirelessly. The display portion 922 can perform high-definition display when the display portion 922 is formed by the liquid crystal display device explained with reference to FIGS. 13A and 13B or by the EL display device explained with reference to FIGS. 14A and 14B.

This application is based on Japanese Patent Application serial no. 2007-162444 filed with Japan Patent Office on Jun. 20, 2007 and Japanese Patent Application serial no. 2007-162464 filed with Japan Patent Office on Jun. 20, 2007, the entire contents of which are hereby incorporated by reference.

What is claimed is:

1. A method of manufacturing a semiconductor device:
preparing a base substrate and a semiconductor substrate;
irradiating the semiconductor substrate with ions, whereby a damaged region is formed in the semiconductor substrate;
forming a bonding layer over at least one of the base substrate and the semiconductor substrate;
attaching the base substrate and the semiconductor substrate to each other with the bonding layer interposed therebetween;
heating the semiconductor substrate and the base substrate by a heating apparatus at a first temperature; and
heating the semiconductor substrate and the base substrate by a rapid thermal annealing apparatus at a second temperature, so that a semiconductor layer separated at the damaged region of the semiconductor substrate is formed over the base substrate with the bonding layer therebetween, wherein the ions include $H^+$ ions, $H_2^+$ ions, and $H_3^+$ ions, and wherein the $H_3^+$ ions occupy 70% or more of the total amount of the $H^+$ ions, the $H_2^\pm$ ions, and the $H_3^+$ ions.

2. The method of manufacturing a semiconductor device according to claim 1, wherein the irradiating with the ions is performed by an ion doping apparatus.

3. The method of manufacturing a semiconductor device according to claim 1,
wherein the first temperature is lower than the second temperature, and
wherein a furnace is used as the heating apparatus.

4. The method of manufacturing a semiconductor device according to claim 1, wherein the second temperature is 400 ° C. or higher and 700 ° C. or lower.

5. A method of manufacturing a semiconductor device:
preparing a base substrate and a semiconductor substrate;
irradiating the semiconductor substrate with ions, whereby a damaged region is formed in the semiconductor substrate;
forming a bonding layer over at least one of the base substrate and the semiconductor substrate;
attaching the base substrate and the semiconductor substrate to each other with the bonding layer interposed therebetween;
heating the semiconductor substrate and the base substrate by a heating apparatus at a first temperature;
heating the semiconductor substrate and the base substrate by a rapid thermal annealing apparatus at a second temperature, so that a semiconductor layer separated at the damaged region of the semiconductor substrate is formed over the base substrate with the bonding layer therebetween;
irradiating a portion of the semiconductor layer with a Group 18 element to form a gettering site; and
heating the semiconductor layer at a third temperature, whereby a metal element in the semiconductor layer is diffused into the gettering site,
wherein the ions include $H^+$ ions, $H_2^+$ ions, and $H_3^+$ ions, and
wherein the $H_3^+$ ions occupy 70% or more of the total amount of the $H^+$ ions, the $H_2^\pm$ ions, and the $H_3^+$ ions.

6. The method of manufacturing a semiconductor device according to claim 5, wherein the irradiating with the ions is performed by an ion doping apparatus.

7. The method of manufacturing a semiconductor device according to claim 5,
wherein the first temperature is lower than the second temperature, and
wherein a furnace is used as the heating apparatus.

8. The method of manufacturing a semiconductor device according to claim 5, wherein the second temperature is 400 ° C. or higher and 700 ° C. or lower.

9. The method of manufacturing a semiconductor device according to claim 5, wherein the third temperature is 500 ° C. or higher and 700 ° C. or lower.

10. A method of manufacturing a semiconductor device:
preparing a base substrate and a semiconductor substrate;
irradiating the semiconductor substrate with ions, whereby a damaged region is formed in the semiconductor substrate;
forming a bonding layer over at least one of the base substrate and the semiconductor substrate;
attaching the base substrate and the semiconductor substrate to each other with the bonding layer interposed therebetween;
heating the semiconductor substrate and the base substrate by a heating apparatus at a first temperature;
heating the semiconductor substrate and the base substrate by a rapid thermal annealing apparatus at a second temperature, so that a semiconductor layer separated at the damaged region of the semiconductor substrate is formed over the base substrate with the bonding layer therebetween;
etching a part of the semiconductor layer to form a semiconductor island;
forming an insulating film over the semiconductor island;
forming a gate electrode over the semiconductor island with the insulating film therebetween; and
forming a source electrode and a drain electrode over the insulating film,
wherein the ions include $H^+$ ions, $H_2^+$ ions, and $H_3^+$ ions, and
wherein the $H_3^+$ ions occupy 70% or more of the total amount of the $H^+$ ions, the $H_2^\pm$ ions, and the $H_3^+$ ions.

11. The method of manufacturing a semiconductor device according to claim 10, wherein the irradiating with the ions is performed by an ion doping apparatus.

12. The method of manufacturing a semiconductor device according to claim 10,
wherein the first temperature is lower than the second temperature, and
wherein a furnace is used as the heating apparatus.

13. The method of manufacturing a semiconductor device according to claim 10, wherein the second temperature is 400° C. or higher and 700 ° C. or lower.

14. A method of manufacturing a semiconductor device:
preparing a base substrate and a semiconductor substrate;
irradiating the semiconductor substrate with ions, whereby a damaged region is formed in the semiconductor substrate;
forming a bonding layer over at least one of the base substrate and the semiconductor substrate;
attaching the base substrate and the semiconductor substrate to each other with the bonding layer interposed therebetween;
heating the semiconductor substrate and the base substrate by a heating apparatus at a first temperature;
heating the semiconductor substrate and the base substrate by a rapid thermal annealing apparatus at a second temperature, so that a semiconductor layer separated at the damaged region of the semiconductor substrate is formed over the base substrate with the bonding layer therebetween;
etching a part of the semiconductor layer to form a semiconductor island;
forming an insulating film over the semiconductor island;
forming a gate electrode over the semiconductor island with the insulating film therebetween;
irradiating a region of the semiconductor island with a Group 18 element to form a gettering site, wherein the region does not overlap with the gate electrode;
heating the semiconductor island at a third temperature, whereby a metal element in the semiconductor island is diffused into the gettering site; and
forming a source electrode and a drain electrode over the insulating film,
wherein the ions include $H^+$ ions, $H_2^+$ ions, and $H_3^+$ ions, and wherein the $H_3^+$ ions occupy 70% or more of the total amount of the $H^+$ ions, the $H_2^+$ ions, and the $H_3^+$ ions.

15. The method of manufacturing a semiconductor device according to claim 14, wherein the irradiating with the ions is performed by an ion doping apparatus.

16. The method of manufacturing a semiconductor device according to claim 14,
wherein the first temperature is lower than the second temperature, and
wherein a furnace is used as the heating apparatus.

17. The method of manufacturing a semiconductor device according to claim 14, wherein the second temperature is 400° C. or higher and 700° C. or lower.

18. The method of manufacturing a semiconductor device according to claim 14, wherein the third temperature is 500° C. or higher and 700° C. or lower.

19. A method of manufacturing a semiconductor device:
preparing a base substrate and a semiconductor substrate;
irradiating the semiconductor substrate with ions, whereby a damaged region is formed in the semiconductor substrate;
forming a bonding layer over at least one of the base substrate and the semiconductor substrate;
attaching the base substrate and the semiconductor substrate to each other with the bonding layer interposed therebetween;
heating the semiconductor substrate and the base substrate by a heating apparatus at a first temperature;
heating the semiconductor substrate and the base substrate by a rapid thermal annealing apparatus at a second temperature, so that a semiconductor layer separated at the damaged region of the semiconductor substrate is formed over the base substrate with the bonding layer therebetween;
etching a part of the semiconductor layer to form a semiconductor island;
forming an insulating film over the semiconductor island;
forming a gate electrode over the semiconductor island with the insulating film therebetween;
irradiating an impurity element serving as a donor or an acceptor into a region of the semiconductor island, wherein the region does not overlap with the gate electrode;
irradiating the region with a Group 18 element to form a gettering site;
heating the semiconductor island at a third temperature, whereby a metal element in the semiconductor island is diffused into the gettering site; and
forming a source electrode and a drain electrode over the insulating film,
wherein the ions include $H^+$ ions, $H_2^+$ ions, and $H_3^+$ ions, and
wherein the $H_3^+$ ions occupy 70% or more of the total amount of the $H^+$ ions, the $H_2^+$ ions, and the $H_3^+$ ions.

20. The method of manufacturing a semiconductor device according to claim 19, wherein the irradiating with the ions is performed by an ion doping apparatus.

21. The method of manufacturing a semiconductor device according to claim 19,
wherein the first temperature is lower than the second temperature, and
wherein a furnace is used as the heating apparatus.

22. The method of manufacturing a semiconductor device according to claim 19, wherein the second temperature is 400° C. or higher and 700° C. or lower.

23. The method of manufacturing a semiconductor device according to claim 19, wherein the third temperature is 500° C. or higher and 700° C. or lower.

24. A method of manufacturing a semiconductor device:
preparing a base substrate and a semiconductor substrate;
irradiating the semiconductor substrate with ions, whereby a damaged region is formed in the semiconductor substrate;
forming a bonding layer over at least one of the base substrate and the semiconductor substrate;
attaching the base substrate and the semiconductor substrate to each other with the bonding layer interposed therebetween;
heating the semiconductor substrate and the base substrate by a heating apparatus at a first temperature;
heating the semiconductor substrate and the base substrate by a rapid thermal annealing apparatus at a second temperature, so that a semiconductor layer separated at the damaged region of the semiconductor substrate is formed over the base substrate with the bonding layer therebetween;
etching a part of the semiconductor layer to form a semiconductor island;
forming an insulating film over the semiconductor island;
forming a gate electrode over the semiconductor island with the insulating film therebetween;
irradiating a region of the semiconductor island with a Group 18 element to form a gettering site, wherein the region does not overlap with the gate electrode;
irradiating an impurity element serving as a donor or an acceptor into the region;
heating the semiconductor island at a third temperature, whereby a metal element in the semiconductor island is diffused into the gettering site; and
forming a source electrode and a drain electrode over the insulating film,
wherein the ions include $H^+$ ions, $H_2^+$ ions, and $H_3^+$ ions, and
wherein the $H_3^+$ ions occupy 70% or more of the total amount of the $H^+$ ions, the $H_2^+$ ions, and the $H_3^+$ ions.

25. The method of manufacturing a semiconductor device according to claim 24, wherein the irradiating with the ions is performed by an ion doping apparatus.

26. The method of manufacturing a semiconductor device according to claim 24,
wherein the first temperature is lower than the second temperature, and
wherein a furnace is used as the heating apparatus.

27. The method of manufacturing a semiconductor device according to claim 24, wherein the second temperature is 400° C. or higher and 700° C. or lower.

28. The method of manufacturing a semiconductor device according to claim 24, wherein the third temperature is 500° C. or higher and 700° C. or lower.

29. A method of manufacturing a semiconductor device:
preparing a base substrate and a semiconductor substrate;
irradiating the semiconductor substrate with ions, whereby a damaged region is formed in the semiconductor substrate;
forming a bonding layer over at least one of the base substrate and the semiconductor substrate;
attaching the base substrate and the semiconductor substrate to each other with the bonding layer interposed therebetween;
heating the semiconductor substrate and the base substrate by a heating apparatus at a first temperature;

heating the semiconductor substrate and the base substrate by a rapid thermal annealing apparatus at a second temperature, so that a semiconductor layer separated at the damaged region of the semiconductor substrate is formed over the base substrate with the bonding layer therebetween;

etching a part of the semiconductor layer to form a semiconductor island;

forming an insulating film over the semiconductor island;

forming a gate electrode over the semiconductor island with the insulating film therebetween;

irradiating an impurity element serving as a donor or an acceptor into a first region of the semiconductor island, wherein the first region does not overlap with the gate electrode;

irradiating a second region of the semiconductor island with a Group 18 element to form a gettering site, wherein the second region is a portion of the first region;

heating the semiconductor island at a third temperature, wherein a metal element in the semiconductor island is diffused into the gettering site; and forming a source electrode and a drain electrode over the insulating film, wherein the ions include $H^+$ ions, $H_2^+$ ions, and $H_3^+$ ions, and wherein the $H_3^+$ ions occupy 70% or more of the total amount of the $H^+$ ions, the $H_2^\pm$ ions, and the $H_3^+$ ions.

30. The method of manufacturing a semiconductor device according to claim 29, wherein the irradiating with the ions is performed by an ion doping apparatus.

31. The method of manufacturing a semiconductor device according to claim 29,
wherein the first temperature is lower than the second temperature, and
wherein a furnace is used as the heating apparatus.

32. The method of manufacturing a semiconductor device according to claim 29, wherein the second temperature is 400° C. or higher and 700° C. or lower.

33. The method of manufacturing a semiconductor device according to claim 29, wherein the third temperature is 500° C. or higher and 700° C. or lower.

34. A method of manufacturing a semiconductor device, comprising:
forming a damaged region in a semiconductor substrate by irradiating the semiconductor substrate with ions included in plasma which is generated by exciting a source gas using a doping apparatus;
forming a bonding layer over at least one of a base substrate and the semiconductor substrate;
attaching the base substrate and the semiconductor substrate to each other with the bonding layer interposed therebetween;
dividing the semiconductor substrate at the damaged region by heating the semiconductor substrate, thereby forming a first semiconductor layer separated from the semiconductor substrate, over the base substrate by a rapid thermal annealing apparatus;
etching a part of the first semiconductor layer to form a second semiconductor layer;
forming an insulating film over the second semiconductor layer;
forming a gate electrode over the second semiconductor layer with the insulating film interposed therebetween;
etching a portion of the insulating film that does not overlap with the gate electrode;
forming an impurity region imparting n-type or p-type conductivity, which includes an impurity element serving as a donor or an acceptor, in a region of the second semiconductor layer that does not overlap with the gate electrode and forming a gettering site region including a Group 18 element next to the impurity region; and
performing heat treatment, thereby gettering a metal element in the second semiconductor layer into the gettering site region,
wherein the ions include $H^+$ ions, $H_2^+$ ions, and $H_3^+$ ions, and
wherein the $H_3^+$ ions occupy 70% or more of the total amount of the $H^+$ ions, the $H_2^\pm$ ions, and the $H_3^+$ ions.

35. The method of manufacturing a semiconductor device according to claim 34, wherein the ions are irradiated with a dosage in a range $1 \times 10^{16}$ ions/cm$^2$ to $6 \times 10^{16}$ ions/cm$^2$.

* * * * *